(12) United States Patent
Matsumoto et al.

(10) Patent No.: US 8,039,890 B2
(45) Date of Patent: Oct. 18, 2011

(54) RANDOM NUMBER GENERATING DEVICE

(75) Inventors: Mari Matsumoto, Yokohama (JP); Ryuji Ohba, Kawasaki (JP); Shinobu Fujita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1138 days.

(21) Appl. No.: 11/743,265

(22) Filed: May 2, 2007

(65) Prior Publication Data

US 2007/0296025 A1 Dec. 27, 2007

(30) Foreign Application Priority Data

May 9, 2006 (JP) ................................. 2006-130817

(51) Int. Cl.
*H01L 29/792* (2006.01)
(52) U.S. Cl. ................ 257/325; 257/411; 257/E29.309; 708/255
(58) Field of Classification Search ................ 257/324, 257/325, 411, E29.309; 708/250, 255
See application file for complete search history.

(56) References Cited

U.S. PATENT DOCUMENTS

| 7,405,423 B2 * | 7/2008 | Tanamoto et al. ............... 257/48 |
| 7,558,813 B2 * | 7/2009 | Tanamoto et al. ............ 708/250 |
| 7,573,094 B2 * | 8/2009 | Ohba et al. ..................... 257/324 |
| 2005/0180219 A1 | 8/2005 | Ohba et al. |
| 2009/0309646 A1 * | 12/2009 | Kobayashi et al. ........... 327/355 |
| 2009/0327379 A1 * | 12/2009 | Matsumoto et al. .......... 708/250 |
| 2010/0057820 A1 * | 3/2010 | Matsumoto et al. .......... 708/250 |

FOREIGN PATENT DOCUMENTS

JP 2005-167165 6/2005

OTHER PUBLICATIONS

Matsumoto et al., Random Number Generator with 0.3MHz Generation Rate using Non-Stoichiometric SiN MOSFET, Extended Abstracts of the 2006 International Conference on Solid State Devices and Materials, Yokohama, 2006, pp. 280-281.*
U.S. Appl. No 12/391,640, filed Feb. 24, 2009, Kobayashi, et al.
J. P. Xu, et al. "1/f Noise in n-Channel Metal-Oxide-Semiconductor Field-Effect Transistors Under Different Hot-Carrier Stresses", Journal of Applied Physics, vol. 86, No. 9, XP 012048937, Nov. 1, 1999, pp. 5203-5206.
U.S. Appl. No. 12/504,998, filed Jul. 17, 2009, Matsumoto, et al.
Shin-ichi Yasuda, et al., "Novel Random Number Generator Using MOS Gate After Soft-Breakdown", Extended Abstracts of the 2002 International Conference on Solid State Devices and Materials, 2002, pp. 250-251.

(Continued)

*Primary Examiner* — Anh Phung
*Assistant Examiner* — Michael Lulis
(74) *Attorney, Agent, or Firm* — Oblon, Spivak, McClelland, Maier & Neustadt, L.L.P.

(57) ABSTRACT

A random number generating device includes a semiconductor device including a source region, a drain region, a channel region provided between the source region and the drain region, and an insulating portion provided on the channel region, the insulating portion including a trap insulating film having traps based on dangling bonds and expressed by $Si_x(SiO_2)_y(Si_3N_4)_{1-y}M_z$ (M is an element other than Si, O, and N, $x \geq 0$, $1 \geq y \geq 0$, $z \geq 0$, the case where $x=0$ and $y=1$ and $z=0$ is excluded), conductivity of the channel region varying randomly depending on the amount of charge caught in the traps, and a random number generating unit connected to the semiconductor device and generating random numbers based on a random variation in the conductivity of the channel region.

13 Claims, 9 Drawing Sheets

OTHER PUBLICATIONS

Takeshi Yoshida, et al., "Quantitative Analysis of Tunneling Current through Ultrathin Gate Oxides", Jpn. J. Appl. Phys., vol. 34, part 2, No. 7B, Jul. 15, 1995, pp. L903-L906.

J. Robertson, "Defects and hydrogen in amorphous silicon nitride", Philosophical Magazine B, vol. 69, No. 2, 1994, pp. 307-326.

S. Hasegawa, et al., "Bonding configuration and defects in amorphous $SIN_x$:H films", Appl. Phys. Lett., vol. 58, No. 7, Feb. 18, 1991, pp. 741-743.

U.S. Appl. No. 12/130,567, filed May 30, 2008, Matsumoto, et al.

* cited by examiner

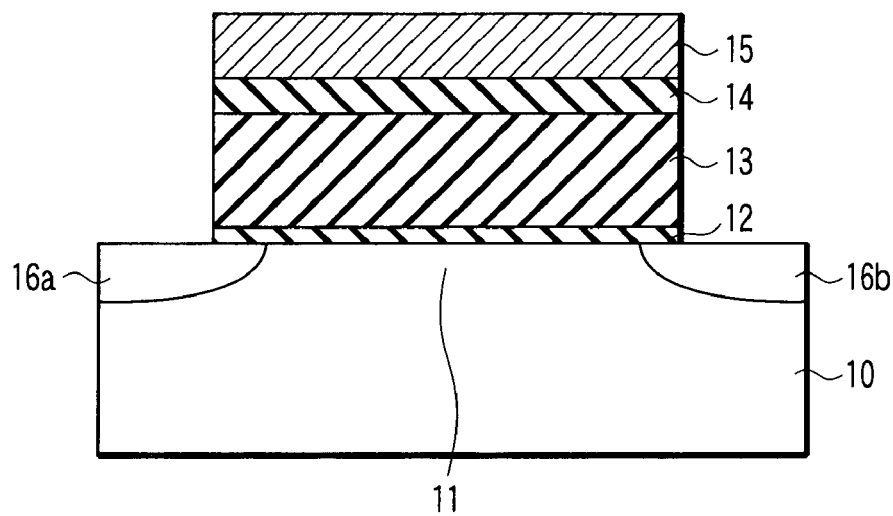
F I G. 1
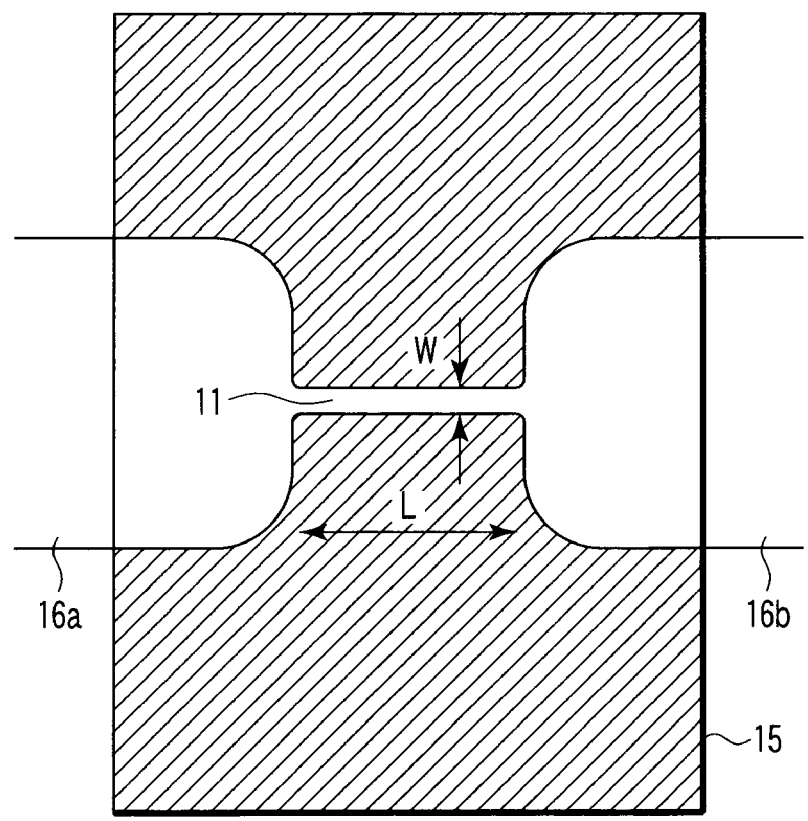
F I G. 2

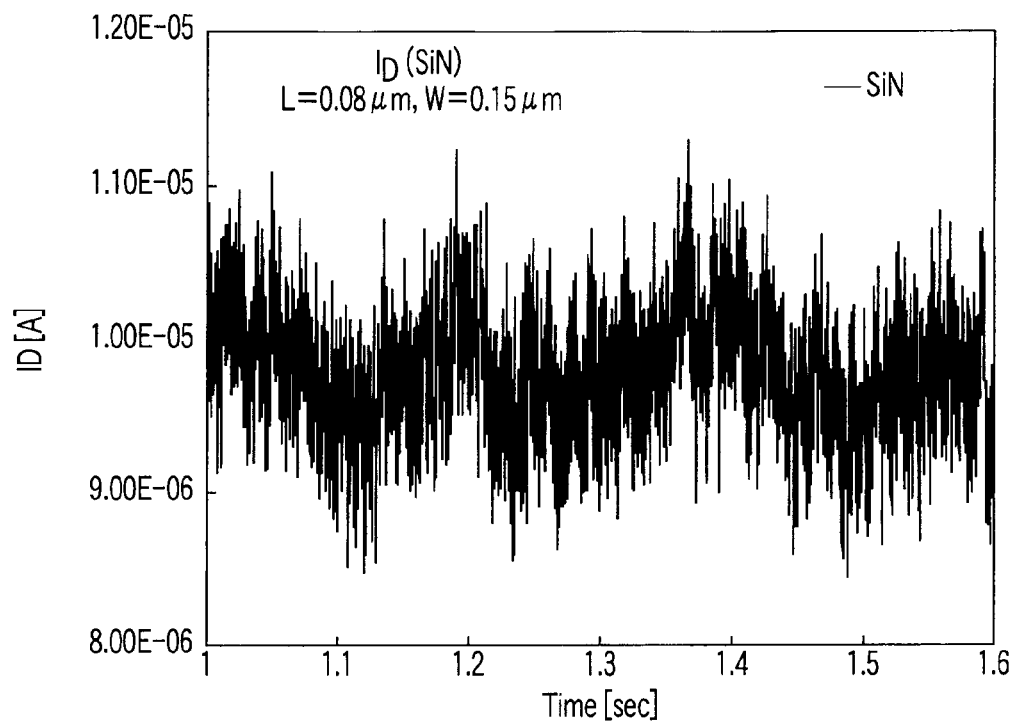
F I G. 3
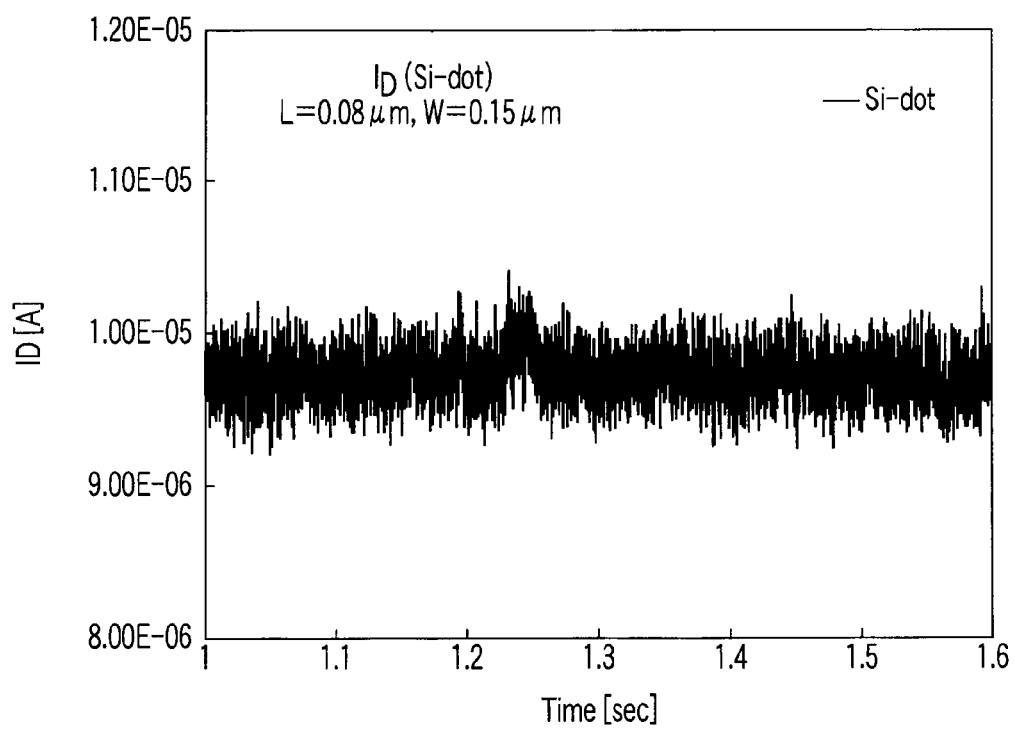
F I G. 4

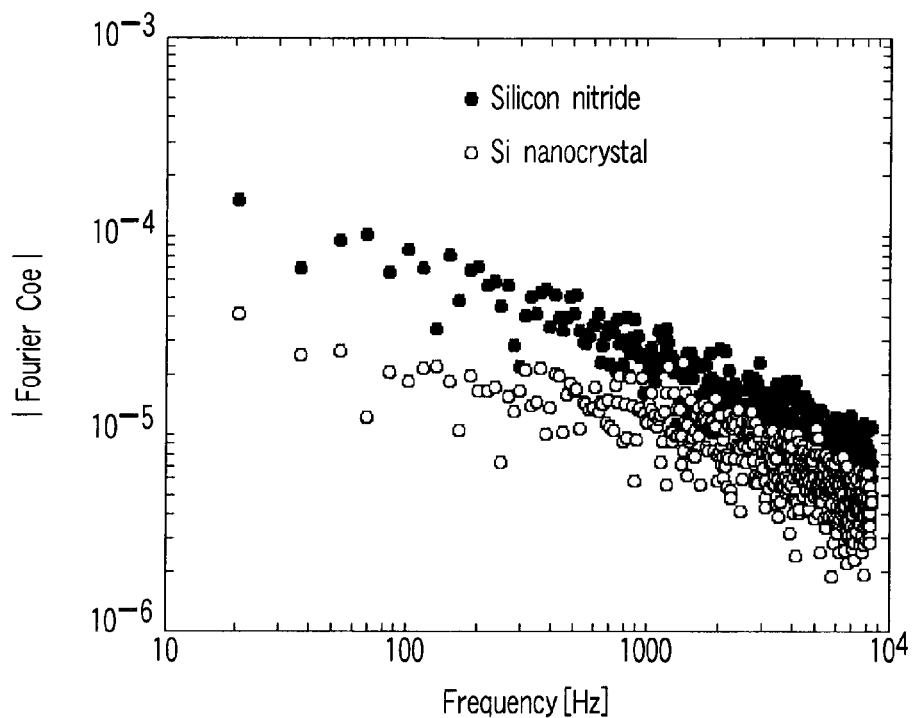
F I G. 5
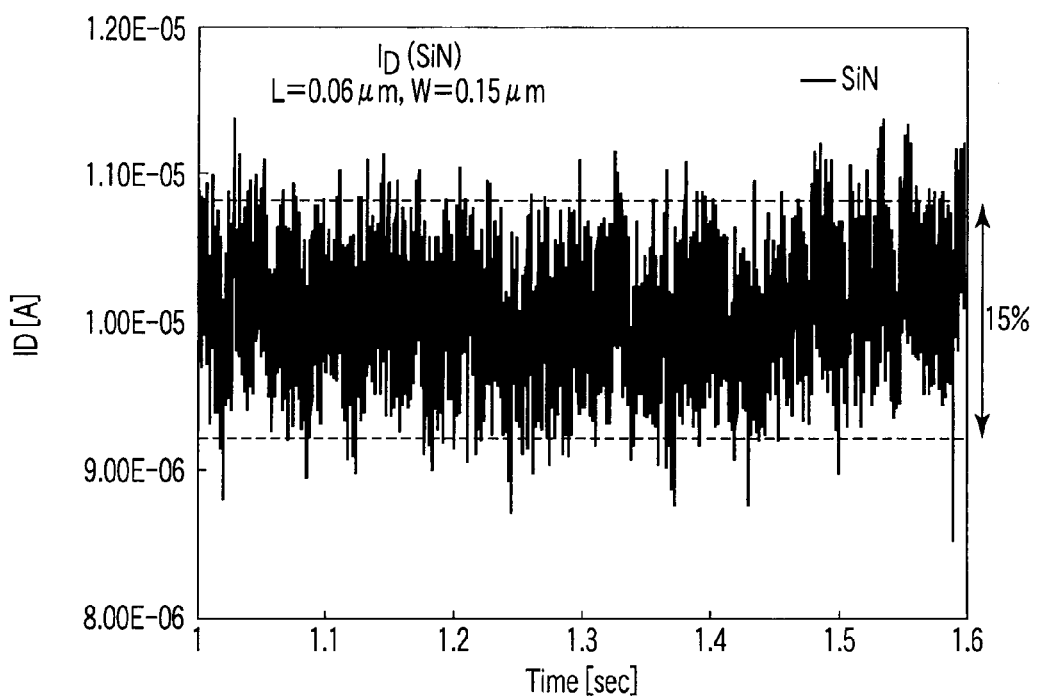
F I G. 6

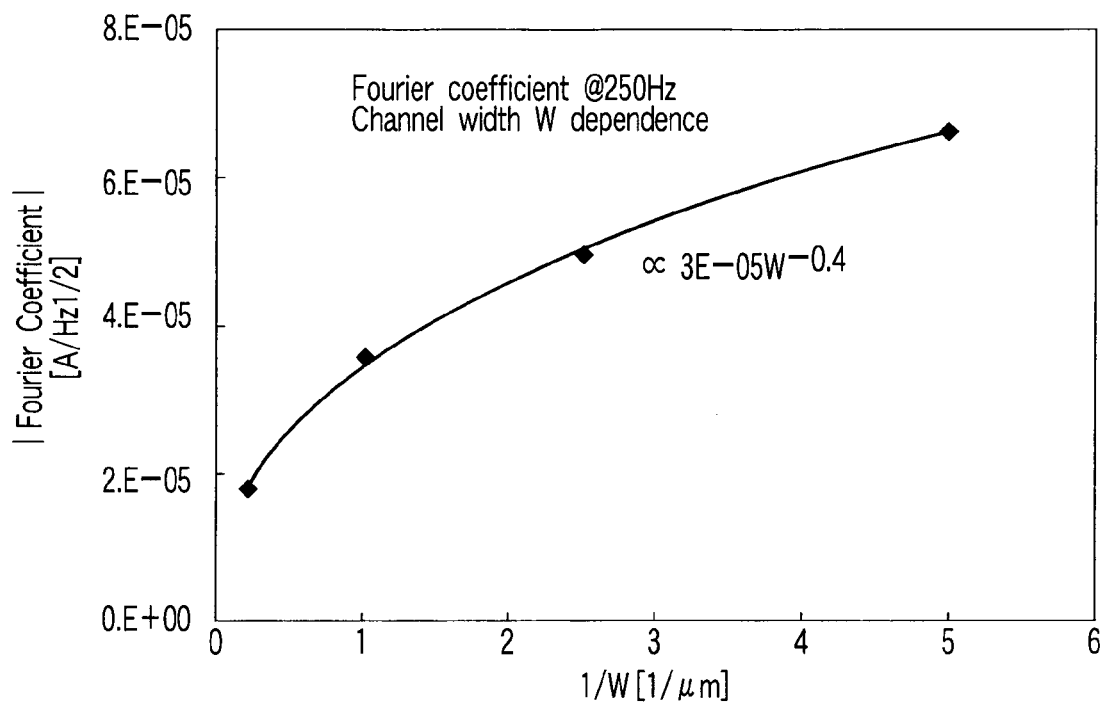
F I G. 9
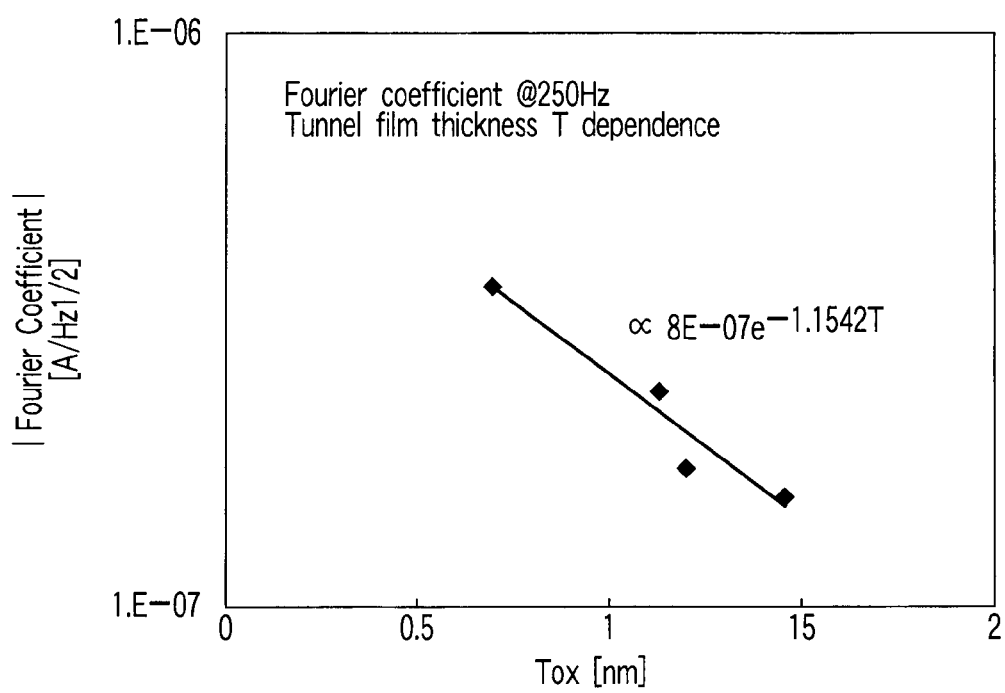
F I G. 10

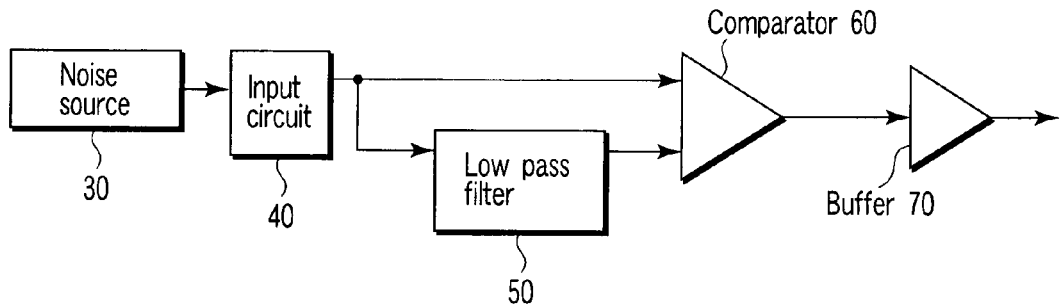
F I G. 13
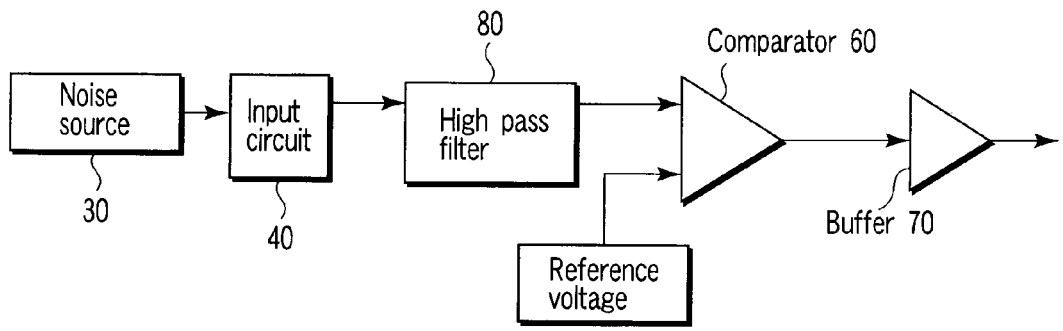
F I G. 14
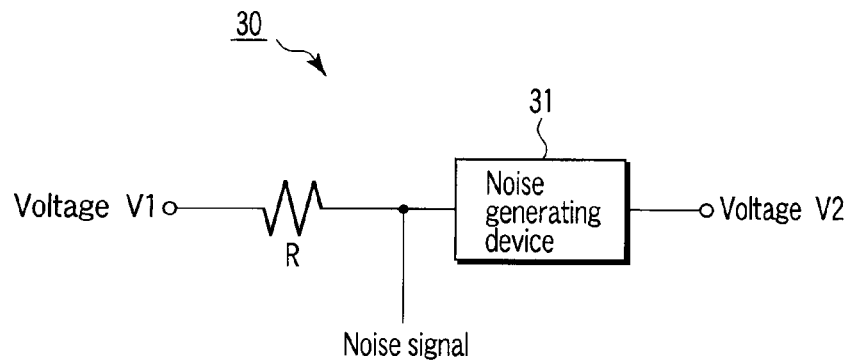
F I G. 15

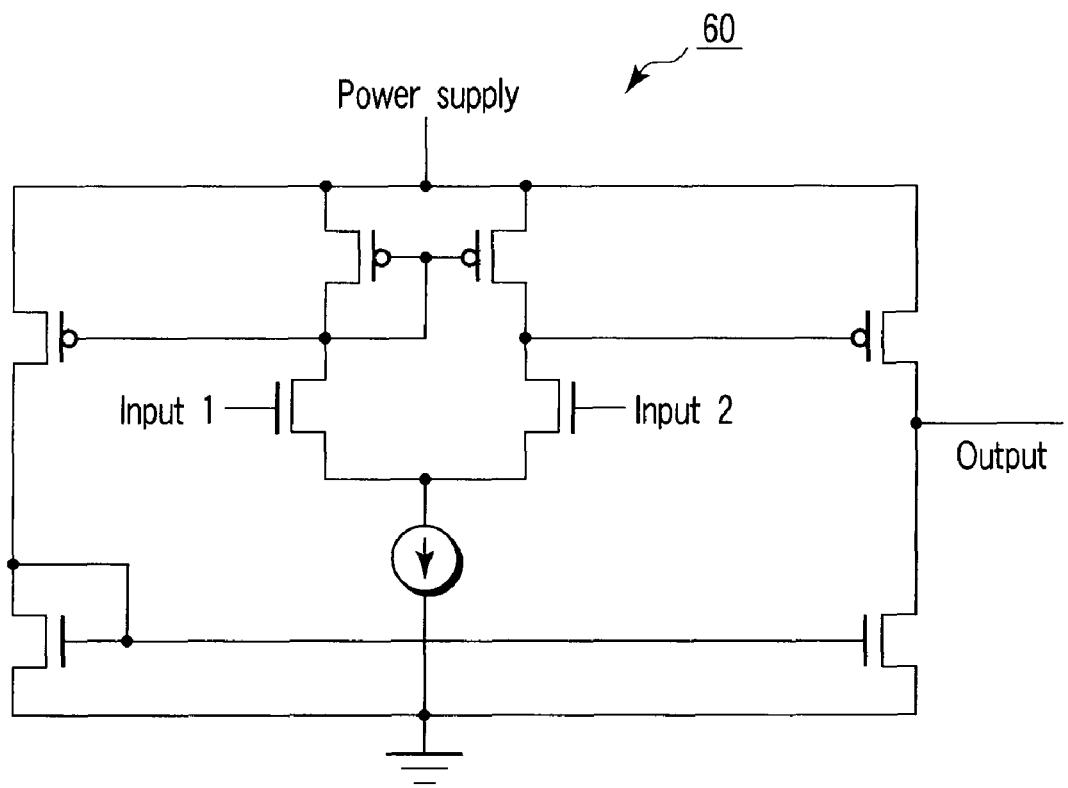
F I G. 18
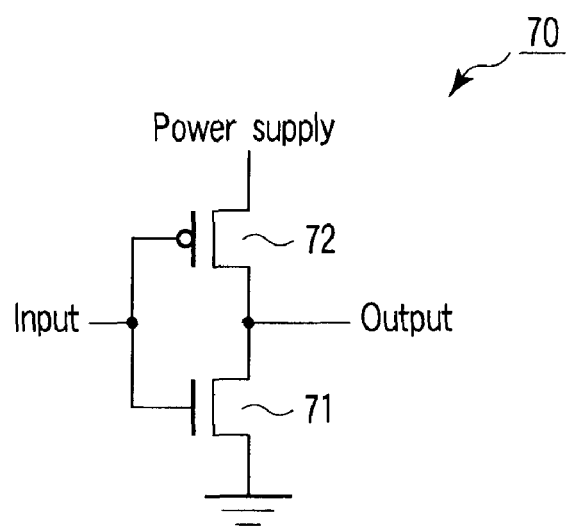
F I G. 19

RANDOM NUMBER GENERATING DEVICE

CROSS-REFERENCE TO RELATED APPLICATIONS

This application is based upon and claims the benefit of priority from prior Japanese Patent Application No. 2006-130817, filed May 9, 2006, the entire contents of which are incorporated herein by reference.

BACKGROUND OF THE INVENTION

1. Field of the Invention

The present invention relates to a random number generating device.

2. Description of the Related Art

Random numbers are used to generate keys for encrypting techniques intended for information security. In recent years, in particular, small and fast random number generating devices have been demanded. Pseudo-random numbers are often used to meet this demand.

However, more advanced security techniques have been required for personal information protection or the like. This requires more unpredictable intrinsic random numbers to be generated so as to keep security. Random noise utilizing a physical phenomenon is effective for generating intrinsic random numbers. A known technique for generating random noise on the basis of the physical phenomenon utilizes a fluctuation in diode current. However, amplification of very low white noise requires a large amplifying circuit, making it difficult to obtain a small random number generating device.

A small, fast, and good random number generating device using Si nano-crystal MOSFETs has been proposed (see JP-A 2005-167165 (KOKAI)). In the Si nano-crystal MOSFET, only a very thin tunnel insulating film is interposed between a channel and conductive nano-particles. Thus, thermal fluctuation causes random electron charging and discharging. This randomly varies a current flowing through the channel, resulting in random noise. Converting the random noise into digital random numbers enables the generation of random numbers.

Normal security systems require random numbers to be generated at a rate of at least 1 Mbits/sec. However, the Si nano-crystal MOSFET produces only a low random noise and thus cannot sufficiently generate good random numbers. Further, achieving a random number generation rate of at least 1 Mbits/sec requires a miniaturizing technique which is both technically and economically difficult to implement.

Thus, small, fast, and good random number generating devices have been required in order to further improve information security. However, it has been difficult to provide small high-performance random number generating devices that can sufficiently generate good random numbers.

BRIEF SUMMARY OF THE INVENTION

An aspect of the present invention, there is provided a random number generating device comprising: a semiconductor device including a source region, a drain region, a channel region provided between the source region and the drain region, and an insulating portion provided on the channel region, the insulating portion including a trap insulating film having traps based on dangling bonds and expressed by $Si_x(SiO_2)_y(Si_3N_4)_{1-y}M_z$ (M is an element other than Si, O, and N; $x \geq 0$, $1 \geq y \geq 0$, $z \geq 0$; the case where x=0 and y=1 and z=0 is excluded), conductivity of the channel region varying randomly depending on the amount of charge caught in the traps; and a random number generating unit connected to the semiconductor device and generating random numbers based on a random variation in the conductivity of the channel region.

BRIEF DESCRIPTION OF THE SEVERAL VIEWS OF THE DRAWING

FIG. 1 is a sectional view schematically showing the configuration of a noise generating device in accordance with a first embodiment and a third embodiment to a seventh embodiment;

FIG. 2 is a plan view schematically showing the configuration of the noise generating device in accordance with the first to seventh embodiments;

FIG. 3 is a diagram showing measurements of a current fluctuation in the noise generating device in accordance with the embodiments;

FIG. 4 is a diagram showing measurements of a current fluctuation in a noise generating device in accordance with the conventional technique;

FIG. 5 is a diagram showing the frequency characteristic of a current fluctuation;

FIG. 6 is a diagram showing measurements of a current fluctuation in the noise generating device in accordance with the embodiments;

FIG. 9 is a diagram showing the relationship between a channel width and the Fourier coefficient for the noise generating device in accordance with the embodiments;

FIG. 10 is a diagram showing the relationship between a tunnel insulating film thickness and the Fourier coefficient for the noise generating device in accordance with the embodiments;

FIG. 13 is an electric circuit diagram showing an example of the general configuration of a random number generating device in accordance with the embodiments;

FIG. 14 is an electric circuit diagram showing another example of the general configuration of the random number generating device in accordance with the embodiments;

FIG. 15 is a diagram showing an example of the configuration of a noise source for the random number generating device in accordance with the embodiments;

FIG. 18 is a diagram showing an example of the configuration of a comparator in the random number generating device in accordance with the embodiments; and FIG. 19 is a diagram showing an example of the configuration of a buffer in the random number generating device in accordance with the embodiments.

DETAILED DESCRIPTION OF THE INVENTION

Figure 7:
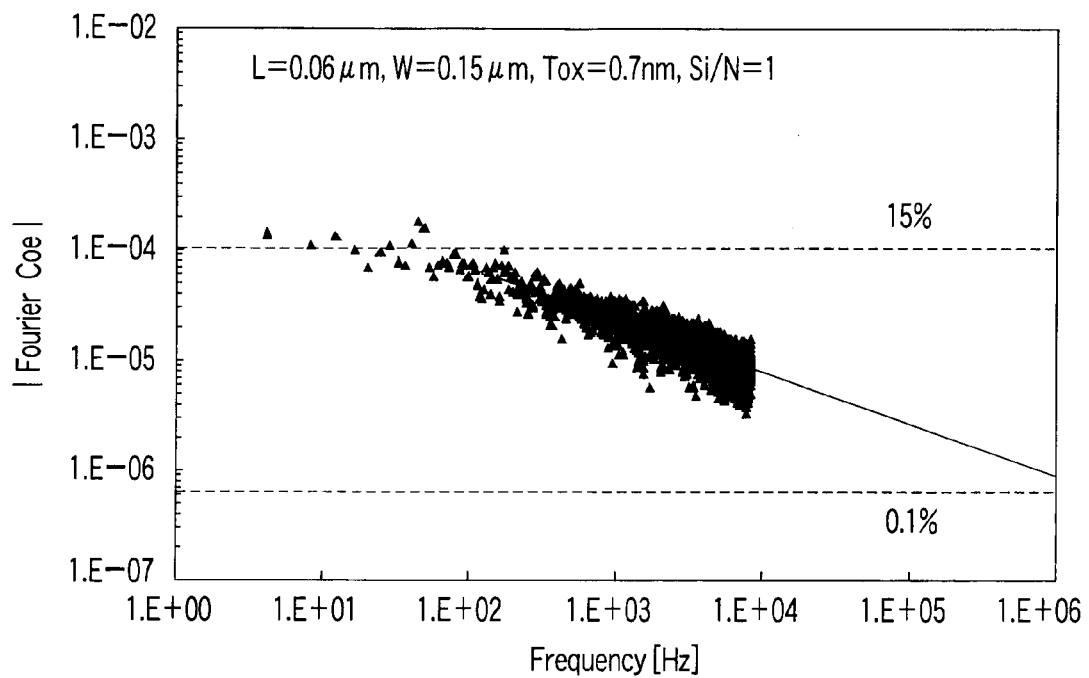
FIG. 7 is a diagram showing the frequency characteristic of a current fluctuation in the noise generating device in accordance with the embodiments.

Embodiments of the present invention will be described below with reference to the drawings.

FIG. 1 is a sectional view schematically showing the configuration of a noise generating device (semiconductor device) in accordance with the embodiments of the present invention.

A source region 16a, a drain region 16b, and a channel region 11 are provided in a surface region of a silicon substrate (semiconductor substrate) 10; the channel region 11 is located between the source region 16a and the drain region 16b. The channel region 11 desirably has a small gate length L and a small channel width (gate width) W. Alternatively, the channel region 11 may partly have a narrow channel with the channel length L and channel width W as shown in FIG. 2. The source region 16a and the drain region 16b contain n-type impurities such as phosphorus (P) or arsenic (As). The channel region 11, the source region 16a, and the drain region 16b are isolated by an isolation insulating region.

A tunnel insulating film 12 is formed on the channel region 11, and a trap insulating film 13 is formed on the tunnel insulating film 12. The tunnel insulating film 12 and the trap insulating film 13 form an insulating portion. The trap insulating film 13 has traps based on dangling bonds and is expressed by the general formula $Si_x(SiO_2)_y(Si_3N_4)_{1-y}M_z$ (M is an element other than Si, O, and N; $x \geq 0$, $1 \geq y \geq 0$, $z \geq 0$; the case where x=0 and y=1 and z=0 is excluded). For example, the trap insulating film 13 is formed of a non-stoichiometric silicon oxinitride film. A control oxide film (control insulting film) 14 is formed on the trap insulating film 13. A gate electrode (control electrode) 15 made of $n^+$-type polysilicon is formed on the control oxide film 14.

As described above, the trap insulating film 13 having the traps based on the dangling bonds is formed in the noise generating device in accordance with the present embodiment. Thus, the noise generating device in accordance with the present embodiment can charge and discharge electrons (charges) between the channel region 11 and the trap insulating film 13 via the tunnel insulating film 12. That is, since only the very thin tunnel insulating film 12 is interposed between the channel region 11 and the trap insulating film 13, thermal fluctuation causes electrons to be randomly charged and discharged. Consequently, the conductivity of the channel region varies randomly depending on the amount of charge caught in the traps in the trap insulating film 13. That is, a current flowing between the source region 16a and the drain region 16b varies randomly depending on the amount of charge caught in the traps. Therefore, random numbers can be generated on the basis of a random variation in the conductivity of the channel region by connecting a random number generating unit described below to the noise generating device.

In the noise generating device in accordance with the present embodiment, the Si-rich trap insulating film 13 increases the number of dangling bonds and thus the number of traps, enabling an increase in the level of random noise. Further, a reduction in the film thickness T of the tunnel insulating film 12 increases tunnel probability, enabling an increase the level of random noise. Moreover, reducing the gate length L and channel width W of the channel region 11 enhances the effect of charged or discharged electrons on a current, enabling an increase the level of random noise. As a result, 1-MHz random noise component can be at least 0.1% in the noise generating device in accordance with the present embodiment.

Conditions under which 1-MHz random noise component is at least 0.1% in the noise generating device in accordance with the present embodiment can be determined on the basis of experimental data. If 1-MHz random noise component is at least 0.1%, intrinsic random numbers can be generated at a random number generation rate of at least 1 Mbits/sec without any amplifying circuit. Specifically, intrinsic random numbers are generated as follows. A multivibrator including the noise generating device is oscillated at 1 MHz. The fluctuation width of an oscillation period is counted by a 1-GHz clock using a ring oscillator (see, for example, S.Yasuda et al., International Conference on Solid State Devices and Materials, pp. 250-251, 2002"). When a fluctuation component in a 1-μs period (frequency: 1 MHz) is at least 1 ns (0.1% of 1 μs), the fastest in general, 1-GHz clock can convert a count value into a digital random number. As a result, intrinsic random numbers can be generated at a random number generation rate of at least 1 MHz/sec without any amplifying circuit.

As already described, the noise generating device in accordance with the present embodiment charges and discharges electrons via the traps based on the dangling bonds. Thus, the noise generating device in accordance with the present embodiment can increase the level of the random noise component compared to, for example, the noise generating device using conductive nano-particles as described in the Related Art section. That is, dangling bonds can be arranged much more densely than the conductive nano-particles. This enables an increase in the number of electrons charged and discharged and thus in the level of the random noise component.

FIGS. 3 to 5 experimentally show the above matters. FIG. 3 is a diagram showing the results of experiments on a current fluctuation with fixed bias in accordance with the present embodiment. FIG. 4 is a diagram showing the results of experiments on a current fluctuation with fixed bias in accordance with the conventional technique. FIG. 5 is a diagram showing a frequency characteristic exhibited in connection with the current fluctuation.

The gate length and channel width (gate width) of the semiconductor narrow channel in the noise generating device are the same between an experimental sample in accordance with the conventional technique and an experimental sample in accordance with the present embodiment. Specifically, the gate length L is 0.08 μm, and the channel width W is 0.15 μm. In the noise generating device in accordance with the conventional technique, the conductive nano-particles have a density Ddot of $1.33 \times 10^{12}$ $cm^{-2}$ and an average particle diameter d of 10 nm. Further, a thermal nitride film is used as a tunnel insulating film and has a film thickness T of 0.7 nm. The noise generating device in accordance with the conventional technique uses near best conductive nano-particles and a near best tunnel insulating film. That is, Si nano-particles (average particle diameter: 10 nm) have the highest density. The tunnel insulating film comprises a thermal nitride film offering a tunnel resistance lower than that of an oxide film. In the noise generating device in accordance with the present embodiment, a silicon-rich silicon nitride film is used as a trap insulating film. Specifically, for the silicon nitride film, the ratio (ratio of the number of atoms) of silicon (Si) to nitrogen (Ni) is 1, that is, Si/N=1. The tunnel insulating film comprises a silicon oxide film having a greater tunnel barrier height than the thermal nitride film. The silicon oxide film has a film thickness T of 0.7 nm.

As shown in FIG. 3, the current fluctuation component of the noise generating device in accordance with the present embodiment is about 15% of the whole current. On the other hand, as shown in FIG. 4, the current fluctuation component of the noise generating device in accordance with the conventional technique is about 5% of the whole current. Thus, the noise generating device in accordance with the present embodiment provides a much larger current fluctuation component than that in accordance with the conventional technique. Further, as shown in FIG. 5, at substantially all frequencies, the noise generating device in accordance with the present embodiment provides a larger current fluctuation component than that in accordance with the conventional technique. Therefore, the noise generating device in accordance with the present embodiment can generate better intrinsic random numbers than that in accordance with the conventional technique.

The embodiments of the present invention will be described below in detail.

First Embodiment

A noise generating device in accordance with the present embodiment uses a silicon oxide film as the tunnel insulating film 12 and an Si-rich silicon nitride film ($Si_UN$:U=1) as the trap insulating film 13 (see FIG. 1).

First, a narrow channel pattern with a width W of 0.15 μm is formed on the silicon substrate 10 by trench isolation or the like. A tunnel insulating film 12 of thickness 0.7 nm is subsequently formed on the channel region 11 by thermal oxidation. An Si-rich silicon nitride film is further formed on the tunnel insulating film 12 as the trap insulating film 13. That is, an Si-rich silicon nitride film 13 ($Si_UN$:U=1) with an Si/N ratio (ratio of the number of atoms) of 1 is formed by LPCVD with the ratio of Si source gas to N source gas adjusted. The Si-rich silicon nitride film 13 has a thickness of 20 nm.

Then, a control insulating film (control oxide film) 14 of thickness 6 nm is formed by LPCVD. An $n^+$-type polysilicon film 15 of thickness 200 nm constituting a gate electrode is further formed by CVD. The $n^+$-type polysilicon film 15 is subsequently patterned through a resist pattern as a mask to form a gate electrode 15. The gate electrode has a gate length L of 0.06 μm. Subsequently, phosphorus (P) or arsenic (As) is ion-implanted, and activation annealing is performed to form an $n^+$-type diffusion layer constituting the source region 16a and the drain region 16b.

As described above, such a noise generating device as shown in FIG. 1 is formed. The noise generating device thus formed can generate random noise in which 1-MHz vibration component is at least 0.1%. Explanation will be given of the reason whey 1-MHz vibration component is at least 0.1% in the noise generating device in accordance with the present embodiment.

FIG. 6 shows the current fluctuation characteristic of the noise generating device in accordance with the present embodiment observed under a fixed bias. The gate length L is 0.06 μm, and the gate width W is 0.15 μm. The tunnel insulating film thickness T is 0.7 nm, and the Si/N ratio of the silicon nitride film 13 is 1. As shown in FIG. 6, the current fluctuation component is about 15% of the whole current.

FIG. 7 is a diagram showing the frequency characteristic of the current characteristic shown in FIG. 6. As seen in FIG. 7, a frequency in which current fluctuation component is 0.1% is about 2.8 MHz. A current fluctuation component at 1 MHz is about 0.16%. This satisfies the condition that the fluctuation component at 1 MHz is at least 0.1%.

Further, a noise generating device with different structural parameters was produced and its characteristics were examined. The structural parameters include the gate length L and channel width (gate width) W of the semiconductor narrow channel, the tunnel insulating film thickness T, and the ratio U of the silicon nitride film ($Si_UN$, U>0.75).

Figure 8:
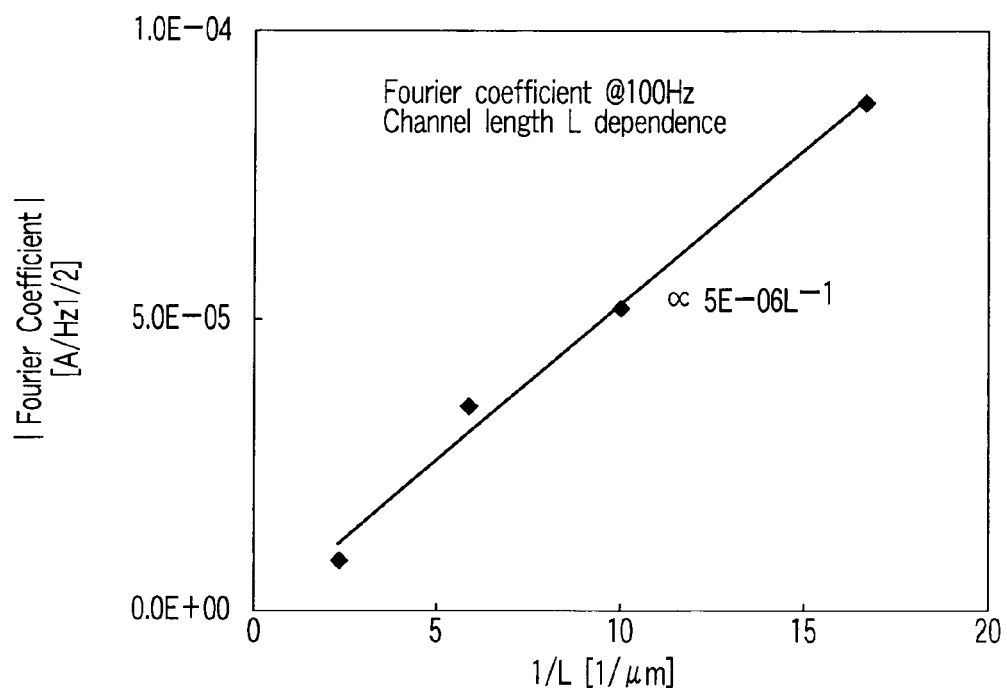
FIG. 8 is a diagram showing the relationship between a gate length and a Fourier coefficient for the noise generating device in accordance with the embodiments.

FIG. 8 is a diagram showing the relationship between the gate length (channel length) L and a Fourier coefficient. W, T, and Si/N are 0.15 μm, 0.7 nm, and 1, respectively. The figure shows the relationship between the gate length L and the Fourier coefficient at 100 Hz. FIG. 8 indicates that the level of random noise is proportional to 1/L.

FIG. 9 is a diagram showing the relationship between the gate width (channel width) W and the Fourier coefficient. L, T, and Si/N are 0.06 μm, 0.7 nm, and 1, respectively. The figure shows the relationship between the gate width W and the Fourier coefficient at 250 Hz. FIG. 9 indicates that the level of random noise is proportional to $W^{-2/5}$.

FIG. 10 is a diagram showing the relationship between the tunnel insulating film thickness T and the Fourier coefficient. L, W, and Si/N are 0.06 μm, 0.15 μm, and 1, respectively. The figure shows the relationship between the tunnel insulating film thickness T and the Fourier coefficient at 250 Hz. FIG. 10 indicates that the level of random noise is proportional to $\exp(-T/0.8664 \text{ [nm]})$.

Figure 11:
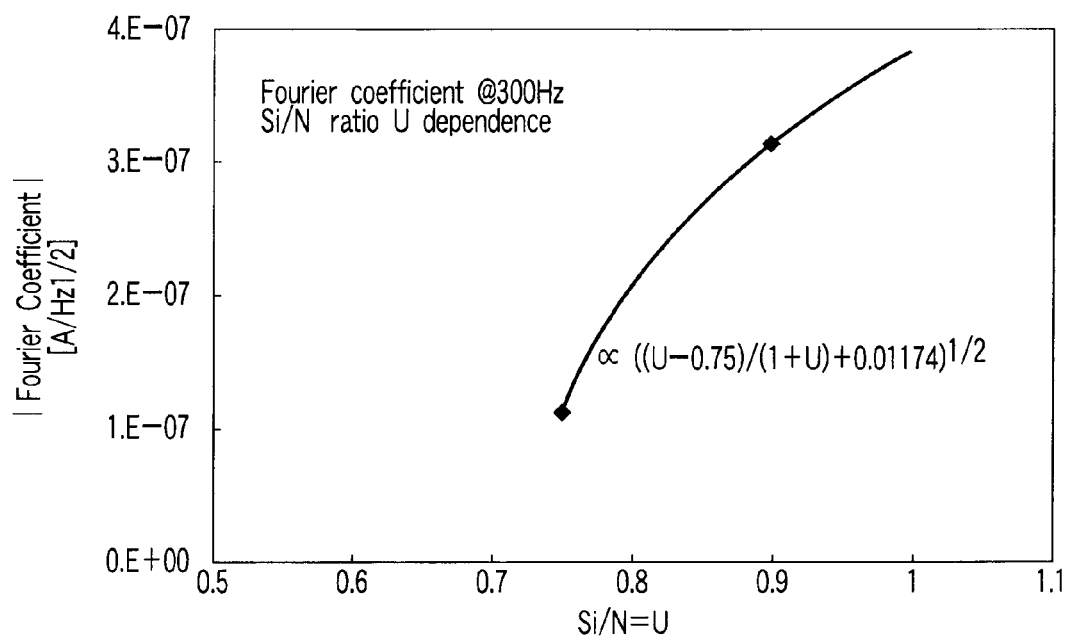
FIG. 11 is a diagram showing the relationship between the Si/N ratio of a silicon nitride film and the Fourier coefficient for the noise generating device in accordance with the embodiments.

FIG. 11 is a diagram showing the relationship between the ratio U of the silicon nitride film ($Si_UN$, U>0.75) and the Fourier coefficient. L, W, and T are 0.06 μm, 0.15 μm, and 0.7 nm, respectively. The figure shows the relationship between the ratio U and the Fourier coefficient at 300 Hz.

FIG. 11 shows $A \times ((U-0.75)/(1+U)+0.01174)^{1/2}$ as a theoretical model. Here, reference character A denotes a constant. This theoretical model is derived from the idea that the fluctuation is proportional to the ½ power of a superimposition number (trap density), on the basis of a statistical law. The term "trap density" as used herein refers to the number of dangling bonds per atom. With the silicon nitride film $Si_UN$, stoichiometry is achieved at U=0.75. Thus, the number of dangling bonds per atom is $(U-0.75)/(1+U)$. Accordingly, the relationship between the ratio of the number of atoms (the number of dangling bonds per atom) and the Fourier coefficient is expressed by the above theoretical model. Further, $A \times 0.01174^{1/2}$ at U=0.75 is a target value for noise intensity in the case where stoichiometry is achieved.

The above various experimental data are obtained by the present inventors on their own through experiments.

Conditions under which fluctuation component at 1 MHz is at least 0.1% in the Fourier coefficient for each parameter are shown below. FIG. 7 shows the dependence of the Fourier coefficient on the frequency observed when the gate length L, the gate width W, the tunnel insulating film thickness T, and the Si/N ratio are 0.06 μm, 0.15 μm, 0.7 nm, and 1, respectively. FIG. 7 indicates that a power law fitting equation for the Fourier coefficient is:

$$|\text{Fourier Coe.}| = 0.0006 f^{-0.4705}$$

This equation enables the value of the Fourier coefficient for 0.1% fluctuation component to be estimated.

A product C indicating the dependence of each parameter is expressed by:

$$C = ((U-0.75)/(1+U)+0.01174)^{1/2} \times \exp(-T/0.8664 \text{ [nm]})/LW^{2/5}$$

When each parameter is equal to the condition shown in FIG. 7, $C=5.87 \text{ [μm}^{-7/5}\text{]}$. Further, the power law fitting equation for the Fourier coefficient indicates that the ratio of the fluctuation component at a frequency of 1 MHz is about 0.16%. It is expected that when the product C of each parameter is greater than 5.87×(0.1/0.16), the fluctuation component at 1 MHz is at least 0.1%. That is, it is expected that the 1-MHz fluctuation component is at least 0.1% when the following relation is met:

$$((U-0.75)/(1+U)+0.01174)^{1/2} \times \exp(-T/0.8664 \text{ [nm]})/LW^{2/5} \geq 5.8678/1.6 = 3.67 \text{ [μm}^{-7/5}]$$

Further, FIG. 10 shows that the Fourier coefficient increases with decreasing tunnel oxide film thickness. FIG. 11 shows that at least when the Si/N ratio is equal to or smaller than 1, the Fourier coefficient increases (the dangling bond density increases) consistently with the Si/N ratio. Thus, the two parameters are fixed, that is, T=0.7 nm and Si/N=1. In this case, if L and W meet the condition $1/(L \times W^{2/5}) \geq 22.25$ [μm$^{-7/5}$], random numbers in which 1-MHz fluctuation component is at least 0.1% can be generated. This condition is met by substituting T=0.7 [nm] and U=1 into:

$$((U-0.75)/(1+U)+0.01174)^{1/2} \times \exp(-T/0.8664 \text{ [nm]})/LW^{2/5} \geq 3.67 \text{ [μm}^{-7/5}]$$

A tunnel resistance Rt varies exponentially in accordance with exp $(4\pi T(2 \text{ mH})^{1/2}/h)$. Here, reference character T denotes the thickness of the tunnel insulating film. Reference character H[eV] denotes the height of the tunnel barrier (the difference in energy between the conduction band edge of the channel semiconductor and the conduction band edge of the tunnel insulating film). Reference characters m denotes the effective mass of direct tunneling. Reference characters π and h denote a circumference ratio and a Planck constant, respectively. The effective mass m of direct tunneling is a value between the conduction band effective mass of the tunnel insulating film (for a silicon oxide film, about 0.5 times as large as electron rest mass) and the conduction band effective mass of the channel semiconductor (with silicon, about 0.19 times as large as the electron rest mass). The value is closer to the conduction band edge effective mass of the channel semiconductor as direct tunneling becomes easier. When direct tunneling is very easy, the effective mass is about 0.3 times as large as the electron rest mass (see, for example, "T. Yoshida et al., Jpn. J. Appl. Phys. Vol. 31 (1995) L903").

Further, easier direct tunneling allows high-frequency noise to be generated at a high speed. That is, high-speed random numbers can be easily generated at a random number rate greater than one (1 Mbits/sec) that is applicable to almost all security systems. The effective mass of direct tunneling is expected to be about 0.3 times as large as the electron rest mass. For an oxide film, the barrier height H is about 3.1 eV. Accordingly, when the thickness of the tunnel oxide film is defined as T [nm], the tunnel resistance Rt is proportional to exp (T/0.25 [nm]). Thus, on the basis of the tunnel resistance and the relationship between the tunnel insulating film thickness and the Fourier coefficient shown in FIG. 10, random noise is expected to be almost proportional to Rt$^{-3/10}$.

In the present embodiment, the gate length L, channel width W, tunnel insulating film thickness T, and ratio U of the number of atoms, which are structural parameters, are L=0.06 [μm], W=0.15 [μm], T=0.70 [μm], and U=1.0. However, the values of the structural parameters are not limited to these. That is, 1-MHz vibration component has only to be at least 0.1%. Conditional expressions can be derived from the relations for the Fourier coefficients for the structural parameters. As already described, the Fourier coefficients for the structural parameters are proportional to 1/L, W$^{-2/5}$, exp (-T/0.8664 [nm]), and ((U-0.75)/(1+U)+0.01174)$^{1/2}$. Therefore, a noise generating device that can generate random numbers in which 1-MHz vibration component is at least 0.1% is obtained when the relation below is satisfied:

$$((U-0.75)/(1+U)+0.01174)^{1/2} \times \exp(-T/0.8664 \text{ [nm]})/LW^{2/5} \geq 3.67 \text{ [μm}^{-7/5}]$$

The present embodiment forms a tunnel oxide film by thermal oxidation. However, a native oxide film, which is formed in the air, may be utilized.

Second Embodiment

Figure 12:
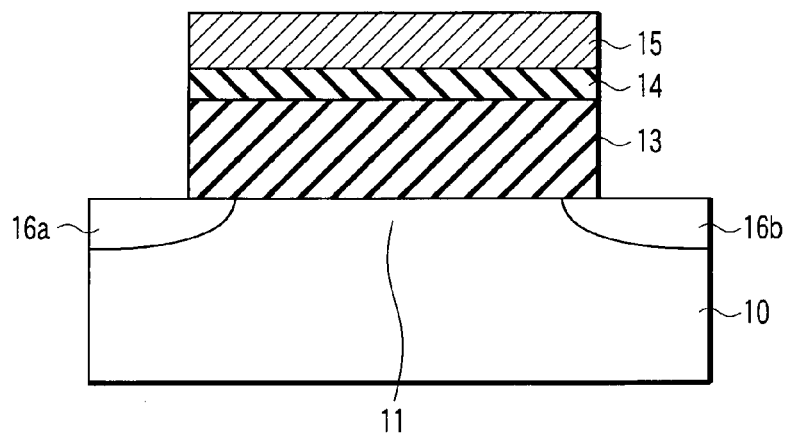
FIG. 12 is a sectional view schematically showing the configuration of a noise generating device in accordance with a second embodiment.

FIG. 12 is a sectional view schematically showing the configuration of a noise generating device (semiconductor device) in accordance with the present embodiment. In the noise generating device in accordance with the present embodiment, no tunnel insulating film is formed and a trap insulating film 13 is formed directly on the silicon substrate 10. The trap insulating film 13 comprises an Si-rich silicon nitride film (Si$_U$N:U=1).

First, a channel pattern of width W 0.15 μm is formed on the silicon substrate 10. The oxide film (not shown) on the channel region 11 is subsequently removed with fluorinated acid. Before a native oxide film is formed, the substrate is immediately loaded into a CVD apparatus, and a silicon nitride film (trap insulating film) 13 of thickness 20 nm (Si/N ratio=1) is formed by deposition. Alternatively, the native oxide film is removed in an SiN deposition apparatus, and a silicon nitride film 13 (Si/N ratio=1) is formed by deposition without being exposed to the air.

Then, a control insulating film (control oxide film) 14 of thickness 6 nm is formed by LPCVD. An n$^+$-type polysilicon film 15 of thickness 200 nm constituting a gate electrode is further formed by CVD. The n$^+$-type polysilicon film 15 is subsequently patterned through a resist pattern as a mask to form a gate electrode 15. The gate electrode has a gate length L of 0.06 μm. Subsequently, phosphorus (P) or arsenic (As) is ion-implanted, and activation annealing is performed to form an n$^+$-type diffusion layer constituting the source region 16a and the drain region 16b.

As described above, such a noise generating device as shown in FIG. 12 is formed. The noise generating device thus formed can generate random noise in which 1-MHz vibration component is at least 0.1%.

The present embodiment does not form any tunnel insulating film. This reduces the tunnel resistance, enabling a larger random noise to be obtained. Consequently, when the silicon nitride film 13 (Si$_U$N, U>0.75) has an Si/N ratio U=1, if L and W meet the condition $1/(L \times W^{2/5}) \geq 22.25$ [μm$^{-7/5}$], random numbers can be generated in which 1-MHz vibration component is at least 0.1%. Therefore, as is the case with the first embodiment, fast and high-quality random numbers can be generated.

Third Embodiment

A noise generating device in accordance with the present embodiment uses hafnium oxide (HfO$_2$) for the tunnel insulating film 12 and an Si-rich silicon nitride film (Si$_U$N:U=1) as the trap insulating film 13 (see FIG. 1). The hafnium oxide film has a lower tunnel barrier height than the silicon oxide film.

First, a channel pattern of width W 0.15 μm is formed on the silicon substrate 10. A hafnium oxide film is subsequently formed on the channel region 11 as the tunnel insulating film 12. An Si-rich silicon nitride film (trap insulating film) 13 is further formed on the tunnel insulating film 12. Specifically, a hafnium (Hf) target is used to form a hafnium oxide film 12 of film thickness $T=0.7\times(3.1/1.5)^{1/2}$ nm by sputtering in an atmosphere containing oxygen. An Si-rich silicon nitride film 13 ($Si_UN:U=1$) is further formed by LPCVD with the ratio of Si source gas to N source gas adjusted. The Si-rich silicon nitride film 13 has a thickness of 20 nm.

Then, a control insulating film (control oxide film) 14 of thickness 6 nm is formed by LPCVD. An $n^+$-type polysilicon film 15 of thickness 200 nm constituting a gate electrode is further formed by CVD. The $n^+$-type polysilicon film 15 is subsequently patterned through a resist pattern as a mask to form a gate electrode 15. The gate electrode has a gate length L of 0.06 μm. Subsequently, phosphorus (P) or arsenic (As) is ion-implanted, and activation annealing is performed to form an $n^+$-type diffusion layer constituting the source region 16a and the drain region 16b.

As described above, such a noise generating device as shown in FIG. 1 is formed. The noise generating device thus formed can generate random noise in which 1-MHz vibration component is at least 0.1%.

In the present embodiment, the Fourier coefficient is proportional to $1/L$, $W^{-2/5}$, $Rt^{-3/10}$, and $((U-0.75)/(1+U)+(0.01174))^{1/2}$. The present embodiment uses a hafnium oxide film with a small tunnel barrier height (H=about 1.5 eV) as the tunnel insulating film 12. Accordingly, $Rt^{-3/10}$ is expressed by:

$$\exp(-0.7\times(3.1/1.5)^{1/2}\times\{1.5/3.1\}^{1/2}/0.8664 \text{ [nm]})/\exp(-0.7/0.8664 \text{ [nm]})=1$$

Therefore, even if an $HfO_2$ film is used as a tunnel insulating film, an amplitude fluctuation is obtained which is similar to that in the first embodiment, which uses an $SiO_2$ film as a tunnel insulating film. Since the tunneling is easy to occur in this case, an effective mass m is 0.3 times as large as the electron rest mass.

In the present embodiment, when the silicon nitride film 13 ($Si_UN$, U>0.75) has an Si/N ratio U of 1 and the tunnel resistance is the same as that of an $SiO_2$ film of thickness 0.7 nm, if L and W meet the condition $1/(L\times W^{2/5})\geq 22.25 \text{ [μm}^{-7/5}\text{]}$, random numbers can be generated in which 1-MHz vibration component is at least 0.1%. Therefore, as is the case with the first embodiment, fast and high-quality random numbers can be generated.

As already discussed, a tunnel insulating film with a tunnel barrier height H[eV] provides random noise of at least 0.1% at 1-MHz provided that the following relationship is satisfied:

$$((U-0.75)/(1+U)+0.01174)^{1/2}\times\exp(-T\{H/3.1 \text{ [eV]}\}^{1/2}/0.8664 \text{ [nm]})/LW^{2/5}\geq 3.67 \text{ [μm}^{-7/5}\text{]}$$

Besides the hafnium oxide film, a cerium oxide film or the like may be used as a tunnel insulating film offering a lower tunnel resistance than the silicon oxide film.

Fourth Embodiment

A noise generating device in accordance with the present embodiment uses a silicon oxide film as the tunnel insulating film 12 and an Si-rich silicon oxide film ($Si_VO:V>0.5$) as the trap insulating film 13 (see FIG. 1). The number of Si dangling bonds per atom in the Si-rich silicon oxide film is the same as that in an Si-rich silicon nitride film ($Si_UN:U=1$).

First, a channel pattern with a width W of 0.15 μm is formed on the silicon substrate 10. A silicon oxide film is subsequently formed on the channel region 11 as a tunnel insulating film 12. An Si-rich silicon oxide film (trap insulating film) 13 is further formed on the tunnel insulating film 12. Specifically, a silicon oxide film 12 of thickness 0.7 nm is formed by thermal oxidation. An Si-rich silicon oxide film 13 ($Si_{0.6}O$) is further formed by LPCVD with the ratio of Si source gas to N source gas adjusted. The Si-rich silicon oxide film 13 has a thickness of 20 nm.

Then, a control insulating film (control oxide film) 14 of thickness 6 nm is formed by LPCVD. An $n^+$-type polysilicon film 15 of thickness 200 nm constituting a gate electrode is further formed by CVD. The $n^+$-type polysilicon film 15 is subsequently patterned through a resist pattern as a mask to form a gate electrode 15. The gate electrode has a gate length L of 0.06 μm. Subsequently, phosphorus (P) or arsenic (As) is ion-implanted, and activation annealing is performed to form an $n^+$-type diffusion layer constituting the source region 16a and the drain region 16b.

As described above, such a noise generating device as shown in FIG. 1 is formed. The noise generating device thus formed can generate random noise in which 1-MHz vibration component is at least 0.1%.

A silicon nitride film offering stoichiometry is $Si_3N_4$. Accordingly, with an Si-rich silicon nitride film ($Si_UN$: U>0.75), the number of Si dangling bonds per atom is $(U-0.75)/(U+1)$. For Si/N=1, U=1 and the number of dangling bonds per atom is 0.125.

On the other hand, a silicon oxide film offering stoichiometry is $SiO_2$. Accordingly, with an Si-rich silicon oxide film ($Si_VO:V>0.5$), the number of excess Si atoms per atom is $(V-0.5)/(V+1)$. One excess Si atom having four valence electrons replaces an O atom having two valence electrons to generate two dangling bonds. Therefore, the number of Si dangling bonds per atom of $Si_VO$ is $\{(V-0.5)/(V+1)\}\times 2$.

If the number of Si dangling bonds per atom in the silicon oxide film ($Si_VO$) is the same as that in a silicon nitride film ($Si_UN:U=1$), V=0.6. In this case, the number of Si dangling bonds per atom in the silicon oxide film is the same as that in the silicon nitride film described in the first embodiment. Therefore, in this case, when the tunnel insulating film has a thickness of 0.7 nm, if L and W meet the condition $1/(L\times W^{2/5})\geq 22.25 \text{ [μm}^{-7/5}\text{]}$, random numbers can be generated in which 1-MHz vibration component is at least 0.1%. Therefore, as is the case with the first embodiment, fast and high-quality random numbers can be generated.

Further, in general, if the gate length L, the gate width W, the tunnel insulating film thickness T, and the Si/O ratio V (V>0.5) have any values, random noise of at least 0.1% can be generated at 1 MHz provided that the following relationship is satisfied:

$$[\{(V-0.5)/(V+1)\}\times 2+0.01174]^{1/2}\times \exp(-T\{H/3.1 \text{ [eV]}\}^{1/2}/0.8664 \text{ [nm]})/LW^{2/5}\geq 3.67 \text{ [μm}^{-7/5}\text{]}$$

The present embodiment produces a tunnel oxide film by thermal oxidation. However, a native oxide film formed in the air may be used as a tunnel oxide film. Alternatively, no tunnel insulating film may be provided as is the case with the second embodiment. Alternatively, as is the case with the third embodiment, a tunnel insulating film may be used which offers the same tunnel resistance as that of a silicon oxide film with a film thickness T of 0.7 nm and which has a smaller tunnel barrier height than the silicon oxide film.

Fifth Embodiment

A noise generating device in accordance with the present embodiment uses a silicon oxide film as the tunnel insulating film 12 and an Si-rich silicon oxinitride film ($Si_x(SiO_2)_y(Si_3N_4)_{1-y}$ (x>0, $1\geq y\geq 0$) as the trap insulating film 13 (see FIG. 1). The number of Si dangling bonds per atom in the Si-rich silicon oxinitride film is the same as that in an Si-rich silicon nitride film ($Si_U N:U=1$).

First, a channel pattern with a width W of 0.15 μm is formed on the silicon substrate 10. A silicon oxide film is subsequently formed on the channel region 11 as a tunnel insulating film 12. An Si-rich silicon oxinitride film (trap insulating film) 13 is further formed on the tunnel insulating film 12. Specifically, a silicon oxide film 12 of thickness 0.7 nm is formed by thermal oxidation. An Si-rich silicon oxinitride film 13 ($Si_x(SiO_2)_y(Si_3N_4)_{1-y}$:x>0, 1≧y≧0) is further formed by LPCVD with the ratio of Si source gas to N source gas adjusted. The Si-rich silicon oxinitride film 13 has a thickness of 20 nm. Furthermore, the relationship $x=(14-15y+4y^2)/(y+14)$ is satisfied.

Then, a control insulating film (control oxide film) 14 of thickness 6 nm is formed by LPCVD. An n$^+$-type polysilicon film 15 of thickness 200 nm constituting a gate electrode is further formed by CVD. The n$^+$-type polysilicon film 15 is subsequently patterned through a resist pattern as a mask to form a gate electrode 15. The gate electrode has a gate length L of 0.06 μm. Subsequently, phosphorus (P) or arsenic (As) is ion-implanted, and activation annealing is performed to form an n$^+$-type diffusion layer constituting the source region 16a and the drain region 16b.

As described above, such a noise generating device as shown in FIG. 1 is formed. The noise generating device thus formed can generate random noise in which 1-MHz vibration component is at least 0.1%.

A silicon nitride film offering stoichiometry is $Si_3N_4$. Accordingly, with an Si-rich silicon nitride film ($Si_U N$: U>0.75), the number of Si dangling bonds per atom is (U−0.75)/(U+1). For Si/N=1, U=1 and the number of dangling bonds per atom is 0.125.

On the other hand, a silicon oxinitride film offering stoichiometry is $(SiO_2)_y(Si_3N_4)_{1-y}$. Accordingly, with an Si-rich silicon oxinitride film ($Si_x(SiO_2)_y(Si_3N_4)_{1-y}$:x>0, 1≧y≧0), the number of excess Si atoms per atom is x/(x+7−4y). One excess Si atom having four valence electrons replaces an N atom having three valence electrons and an O atom having two valence electrons to generate dangling bonds. The probability at which an Si atom replaces an N atom or an O atom depends on the ratio of N to O. Therefore, the number of Si dangling bonds per atom in the Si-rich silicon oxinitride film ($Si_x(SiO_2)_y(Si_3N_4)_{1-y}$:x>0, 1≧y≧0) is:

$$x/(x+7-4y)\times[(4-4y)/(4-2y)+\{2y/(4-2y)\}\times 2]$$

That is, in the present embodiment, the number of Si dangling bonds per atom is:

$$x/(x+7-4y)\times[(4-4y)/(4-2y)+\{2y/(4-2y)\}\times 2]=0.125$$

The x and y values are determined so as to meet this conditional expression. For example, for y=0.5, x=15/29.

It is assumed that the number of Si dangling bonds per atom in Si-rich silicon oxinitride film ($Si_x(SiO_2)_y(Si_3N_4)_{1-y}$:x>0, 1≧y≧0) is the same as that in the silicon nitride film ($Si_U N$: U=1) in the first embodiment and that the tunnel insulating film has a thickness of 0.7 nm. In this case, if L and W meet the condition $1/(L\times W^{2/5})\geqq 22.25$ [μm$^{-7/5}$], random numbers can be generated in which 1-MHz vibration component is at least 0.1%. Therefore, as is the case with the first embodiment, fast and high-quality random numbers can be generated.

In general, if the gate length L, the gate width W, the tunnel insulating film thickness T, and the atom ratios x and y (x>0, 1≧y≧0) have any values, random noise of at least 0.1% can be generated at 1 MHz provided that the following relationship is satisfied:

$$[x/(x+7-4y)\times\{(4-4y)/(4-2y)+2y/(4-2y)\times 2\}+0.01174]^{1/2}\times$$
$$\exp(-T\{H/3.1[\mathrm{eV}]\}^{1/2}/0.8664[\mathrm{nm}])/LW^{2/5} \geq 3.67[\mu\mathrm{m}^{-7/5}]$$

Moreover, if the trap insulating film is expressed by ($Si_x(SiO_2)_y(Si_3N_4)_{1-y}M_z$ (M is an element other than Si, O, and N, x>0, 1≧y≧0, z≧0), random noise of at least 0.1% can be generated at 1 MHz provided that the following relationship is satisfied:

$$[x/(x+7-4y+z)\times\{(4-4y)/(4-2y)+2y/(4-2y)\times 2\}+0.01174]^{1/2}\times$$
$$\exp(-T\{H/3.1[\mathrm{eV}]\}^{1/2}/0.8664[\mathrm{nm}])/LW^{2/5} \geq 3.67[\mu\mathrm{m}^{-7/5}]$$

The present embodiment produces a tunnel oxide film by thermal oxidation. However, a native oxide film formed in the air may be used as a tunnel oxide film. Alternatively, no tunnel insulating film may be provided as is the case with the second embodiment. Alternatively, as is the case with the third embodiment, a tunnel insulating film may be used which offers the same tunnel resistance as that of a silicon oxide film with a film thickness T of 0.7 nm and which has a smaller tunnel barrier height than the silicon oxide film.

Sixth Embodiment

As is the case with the fifth embodiment, a noise generating device in accordance with the present embodiment uses a silicon oxide film as the tunnel insulating film 12 and an Si-rich silicon oxinitride film ($Si_x(SiO_2)_y(Si_3N_4)_{1-y}$ (x>0, 1≧y≧0) as the trap insulating film 13 (see FIG. 1). The number of Si dangling bonds per atom in Si-rich silicon oxinitride film is the same as that in an Si-rich silicon nitride film ($Si_U N:U=1$). In the noise generating device in accordance with the present embodiment, 1-MHz vibration component (a fluctuation component at 1 MHz) is at least 1%.

As already described, to generate random numbers that are applicable to almost all security systems, it is desirable to generate random numbers at a rate of at least 1 Mbits/sec. A multivibrator or the like including the noise generating device is oscillated at 1 MHz. The fluctuation width of an oscillation period is counted by a 1-GHz clock using a ring oscillator. The count value is converted into a digital random number, enabling a fluctuation component in a 1-μs period (frequency: 1 MHz) to be at least 1 ns (0.1% of 1 μs). As a result, intrinsic random numbers can be generated at a random number generation rate of at least 1 MHz/sec without any amplifying circuit.

Small instruments such as cell phones desirably use a smaller clock frequency of about 100 MHz. To use a multivibrator or the like to cause oscillation at 1 MHz, it is desirable that the fluctuation component in a 1-μs period is at least 10 ns (the reciprocal of a clock frequency of 100 MHz). Thus, in the present embodiment, description will be given of a noise generating device meeting these conditions, that is, a noise generating device in which fluctuation component at 1 MHz is at least 1%.

With reference to FIG. 1, description will be given of a process for manufacturing a noise generating device in accordance with the present embodiment.

First, a channel pattern with a width W of 0.02 μm is formed on the silicon substrate 10. A silicon oxide film is subsequently formed on the channel region 11 as a tunnel insulating film 12. An Si-rich silicon oxinitride film (trap insulating film) 13 is further formed on the tunnel insulating film 12. Specifically, a silicon oxide film 12 of thickness 0.7 nm is formed by thermal oxidation. An Si-rich silicon oxinitride film 13 ($Si_x(SiO_2)_y(Si_3N_4)_{1-y}$:x>0, 1≧y≧0) is further formed by LPCVD with the ratio of Si source gas to O source gas adjusted. The Si-rich silicon oxinitride film 13 has a thickness of 20 nm. Furthermore, the relationship $x=(14-15y+4y^2)/(y+14)$ is satisfied.

Then, a control insulating film (control oxide film) 14 of thickness 6 nm is formed by LPCVD. An $n^+$-type polysilicon film 15 of thickness 200 nm constituting a gate electrode is further formed by CVD. The $n^+$-type polysilicon film 15 is subsequently patterned through a resist pattern as a mask to form a gate electrode 15. The gate electrode has a gate length L of 0.02 μm. Subsequently, phosphorus (P) or arsenic (As) is ion-implanted, and activation annealing is performed to form an $n^+$-type diffusion layer constituting the source region 16a and the drain region 16b.

As described above, such a noise generating device as shown in FIG. 1 is formed. The noise generating device thus formed can generate random noise in which 1-MHz vibration component is at least 1%.

The noise generating device shown in the first embodiment has a gate length L of 0.06 μm and a channel width W of 0.15 μm. The noise generating device in accordance with the present embodiment has a gate length L of 0.02 μm and a channel width W of 0.02 μm. Since the level of a noise component is proportional to 1/L as described in the first embodiment, the level of a noise component based on the gate length L is three times as high as that provided by the noise generating device shown in the first embodiment. Further, since the level of a noise component is proportional to $W^{-0.4}$ as described in the first embodiment, the level of a noise component based on the channel width W is about 2.24 times as high as that provided by the noise generating device shown in the first embodiment. Consequently, the noise generating device in accordance with the present embodiment provides a noise component the level of which is about 6.72 times (3×2.24=6.72) as high as that provided by the noise generating device in accordance with the first embodiment. The first embodiment provides about 0.16% current fluctuation at 1 MHz as shown in FIG. 7. In the present embodiment, since the values of L and W are reduced, 1-MHz vibration component is 1.075% (0.16×6.72=1.075). Therefore, fluctuation component of at least 1% can be obtained.

As already described, with an Si-rich silicon nitride film ($Si_UN$:U>0.75), the number of Si dangling bonds per atom is (U−0.75)/(U+1). For Si/N=1, U=1 and the number of dangling bonds per atom is 0.125.

On the other hand, a silicon oxinitride film offering stoichiometry is $(SiO_2)_y(Si_3N_4)_{1-y}$. Accordingly, with an Si-rich silicon oxinitride film ($Si_x(SiO_2)_y(Si_3N_4)_{1-y}$:x>0, 1≧y≧0), the number of excess Si atoms per atom is x/(x+7−4y). One excess Si atom having four valence electrons replaces an N atom having three valence electrons and an O atom having two valence electrons to generate dangling bonds. The probability at which an Si atom replaces an N atom or an O atom depends on the ratio of N to O. Further, an Si atom replaces an N atom having three valence electrons to generate one dangling bond. An Si atom replaces an O atom having two valence electrons to generate two dangling bonds. Therefore, the number of Si dangling bonds per atom in the Si-rich silicon oxinitride film ($Si_x(SiO_2)_y(Si_3N_4)_{1-y}$:x>0, 1≧y≧0) is:

$$x/(x+7-4y)\times[(4-4y)/(4-2y)+\{2y/(4-2y)\}\times 2]$$

That is, in the present embodiment, the number of Si dangling bonds per atom is:

$$x/(x+7-4y)\times[(4-4y)/(4-2y)+\{2y/(4-2y)\}\times 2]=0.125$$

The x and y values are determined so as to meet this conditional expression. For example, for y=0.5, x=15/29.

It is assumed that the number of Si dangling bonds per atom in Si-rich silicon oxinitride film ($Si_x(SiO_2)_y(Si_3N_4)_{1-y}$:x>0, 1≧y≧0) is the same as that in the silicon nitride film ($Si_UN$:U=1) in the first embodiment and that the tunnel insulating film has a thickness of 0.7 nm. In this case, if L and W meet the condition $1/(L\times W^{2/5})\geq 2.23\times 10^2$ [$\mu m^{-7/5}$], random numbers can be generated in which 1-MHz vibration component is at least 1%. Therefore, fast and high-quality random numbers can be generated.

In general, if the gate length L, the gate width W, the tunnel insulating film thickness T, and the atom ratios x and y (x>0, 1≧y≧0) have any values, random noise of at least 1% can be generated at 1 MHz provided that the following relationship is satisfied:

$$[x/(x+7-4y)\times\{(4-4y)/(4-2y)+2y/(4-2y)\times 2\}+0.01174]^{1/2}\times$$
$$\exp(-T\{H/3.1[eV]\}^{1/2}/0.8664[nm])/LW^{2/5}\geq 36.67[\mu m^{-7/5}]$$

Moreover, if the trap insulating film is expressed by $(Si_x(SiO_2)_y(Si_3N_4)_{1-y}M_z$ (M is an element other than Si, O, and N, x>0, 1≧y≧0, z≧0), random noise of at least 1% can be generated at 1 MHz provided that the following relationship is satisfied:

$$[x/(x+7-4y+z)\times\{(4-4y)/(4-2y)+2y/(4-2y)\times 2\}+0.01174]^{1/2}\times$$
$$\exp(-T\{H/3.1[eV]\}^{1/2}/0.8664[nm])/LW^{2/5}\geq 36.67[\mu m^{-7/5}]$$

The present embodiment produces a tunnel oxide film by thermal oxidation. However, a native oxide film formed in the air may be used as a tunnel oxide film. Alternatively, no tunnel insulating film may be provided as is the case with the second embodiment. Alternatively, as is the case with the third embodiment, a tunnel insulating film may be used which offers the same tunnel resistance as that of a silicon oxide film with a film thickness T of 0.7 nm and which has a smaller tunnel barrier height than the silicon oxide film.

Seventh Embodiment

As is the case with the fifth embodiment, a noise generating device in accordance with the present embodiment uses a silicon oxide film as the tunnel insulating film 12 and an Si-rich silicon oxinitride film ($Si_x(SiO_2)_y(Si_3N_4)_{1-y}$ (x>0, 1≧y≧0) as the trap insulating film 13 (see FIG. 1). The number of Si dangling bonds per atom in Si-rich silicon oxinitride film is the same as that in an Si-rich silicon nitride film ($Si_UN$:U=1). In the noise generating device in accordance with the present embodiment, 1-MHz vibration component (a fluctuation component at 1 MHz) is at least 0.01%.

With reference to FIG. 1, description will be given of a process for manufacturing a noise generating device in accordance with the present embodiment.

First, a channel pattern with a width W of 0.6 μm is formed on the silicon substrate 10. A silicon oxide film is subsequently formed on the channel region 11 as a tunnel insulating film 12. An Si-rich silicon oxinitride film (trap insulating film) 13 is further formed on the tunnel insulating film 12. Specifically, a silicon oxide film 12 of thickness 0.7 nm is formed by thermal oxidation. An Si-rich silicon oxinitride film 13 ($Si_x(SiO_2)_y(Si_3N_4)_{1-y}$:x>0, 1≧y≧0) is further formed by LPCVD with the ratio of Si source gas to O source gas adjusted. The Si-rich silicon oxinitride film 13 has a thickness of 20 nm. Furthermore, the relationship $x=(14-15y+4y^2)/(y+14)$ is satisfied.

Then, a control insulating film (control oxide film) 14 of thickness 6 nm is formed by LPCVD. An n⁺-type polysilicon film 15 of thickness 200 nm constituting a gate electrode is further formed by CVD. The n⁺-type polysilicon film 15 is subsequently patterned through a resist pattern as a mask to form a gate electrode 15. The gate electrode has a gate length L of 0.5 μm. Subsequently, phosphorus (P) or arsenic (As) is ion-implanted, and activation annealing is performed to form an n⁺-type diffusion layer constituting the source region 16a and the drain region 16b.

As described above, such a noise generating device as shown in FIG. 1 is formed. The noise generating device thus formed can generate random noise in which 1-MHz vibration component is at least 0.01%.

The noise generating device shown in the first embodiment has a gate length L of 0.06 μm and a channel width W of 0.15 μm. The noise generating device in accordance with the present embodiment has a gate length L of 0.5 μm and a channel width W of 0.6 μm. Since the level of a noise component is proportional to 1/L as described in the first embodiment, the level of a noise component based on the gate length L is about 0.12 times as high as that provided by the noise generating device shown in the first embodiment. Further, since the level of a noise component is proportional to $W^{-0.4}$ as described in the first embodiment, the level of a noise component based on the channel width W is about 0.57 times as high as that provided by the noise generating device shown in the first embodiment. Consequently, the noise generating device in accordance with the present embodiment provides a noise component the level of which is about 0.069 times (0.12×0.57=0.069) as high as that provided by the noise generating device in accordance with the first embodiment. The first embodiment provides about 0.16% current fluctuation at 1 MHz as shown in FIG. 7. In the present embodiment, by determining the values of L and W as described above, 1-MHz vibration component is 0.011% (0.16×0.069=0.011). Therefore, fluctuation component of at least 0.01% can be obtained at 1 MHz.

It is assumed that the number of Si dangling bonds per atom in Si-rich silicon oxinitride film ($Si_x(SiO_2)_y(Si_3N_4)_{1-y}$:x>0, 1≧y≧0) is the same as that in the silicon nitride film ($Si_UN$: U=1) in the first embodiment and that the tunnel insulating film has a thickness of 0.7 nm. In this case, if L and W meet the condition $1/(L \times W^{2/5}) \geq 2.23$ [μm$^{-7/5}$], random numbers can be generated in which 1-MHz vibration component is at least 0.01%. Therefore, fast and high-quality random numbers can be generated.

In general, if the gate length L, the gate width W, the tunnel insulating film thickness T, and the atom ratios x and y (x>0, 1≧y≧0) have any values, random noise of at least 0.01% can be generated at 1 MHz provided that the following relationship is satisfied:

$$[x/(x+7-4y) \times \{(4-4y)/(4-2y) + 2y/(4-2y) \times 2\} + 0.01174]^{1/2} \times \exp(-T\{H/3.1[eV]\}^{1/2}/0.8664[nm])/LW^{2/5} \geq 0.37[\mu m^{-7/5}]$$

Moreover, if the trap insulating film is expressed by ($Si_x(SiO_2)_y(Si_3N_4)_{1-y}M_z$ (M is an element other than Si, O, and N, x>0, 1≧y≧0, z≧0), random noise of at least 0.01% can be generated at 1 MHz provided that the following relationship is satisfied:

$$[x/(x+7-4y+z) \times \{(4-4y)/(4-2y) + 2y/(4-2y) \times 2\} + 0.01174]^{1/2} \times \exp(-T\{H/3.1[eV]\}^{1/2}/0.8664[nm])/LW^{2/5} \geq 0.37[\mu m^{-7/5}]$$

The present embodiment produces a tunnel oxide film by thermal oxidation. However, a native oxide film formed in the air may be used as a tunnel oxide film. Alternatively, no tunnel insulating film may be provided as is the case with the second embodiment. Alternatively, as is the case with the third embodiment, a tunnel insulating film may be used which offers the same tunnel resistance as that of a silicon oxide film with a film thickness T of 0.7 nm and which has a smaller tunnel barrier height than the silicon oxide film.

As described above, in the noise generating device in accordance with the present embodiment, the conductivity of the channel region varies randomly depending on the amount of charge caught in the traps in the trap insulating film. That is, a current flowing between the source region and the drain region varies randomly depending on the amount of charge caught in the traps. Accordingly, connecting a random number generating unit to the noise generating device enables the generation of random numbers based on a random variation in the conductivity of the channel region. Such a random number generating unit will be described below. The matters described below are also applicable not only to the present embodiment but also to the already described embodiments.

The random number generating unit may comprise a multivibrator including the noise generating device as already described. A random number generating unit shown below includes a low pass filter (or a high pass filter) and a comparator can generate random numbers faster than one using a multivibrator.

With the noise generating device in accordance with the embodiments of the present invention, the magnitude of the effect of fluctuation of one electron increases with decreasing number of conduction electrons. The level of noise increases with increasing resistance. However, for a digital random number converting circuit (random number generating unit) using a multivibrator, the random number generation speed decreases with increasing resistance value. This is expected to limit the random number generation speed. The random number generation speed can be increased by connecting the noise generating device to a digital random number converting circuit including a low pass filter (or a high pass filter) and a comparator.

FIG. 13 is an electric circuit diagram showing the general configuration of a digital random number converting circuit including a low pass filter and a comparator.

A noise signal output by a noise source 30 including the noise generating device is input to an input circuit 40. An output signal from the input circuit 40 is input to a low pass filter 50 and one terminal of a comparator 60. An output signal from the low pass filter 50 is input to the other terminal of the comparator 60. The input circuit 40 is provided for the reason explained below. That is, the direct connection between the noise source 30 and the filter 50 or comparator 60 may prevent sufficient noise from being obtained under the adverse effect of the filter 50 or comparator 60. Thus, the input circuit 40 is provided in order to hinder the adverse effects of the filter 50 or the comparator 60.

The comparator 60 compares two signals input to the comparator 60 to output a high level signal or a low level signal. The low pass filter 50 removes a high frequency component from a noise signal. Consequently, the appropriate selection of a cutoff frequency allows the low pass filter 50 to output almost the median of the input signal. However, the output level of the comparator 60 may be insufficient depending on the levels of the signals input to the comparator 60 or the rates of variations in input signals. Thus, in FIG. 13, a buffer 70 is connected to the comparator 60. The buffer 70 amplifies an output from the comparator 60 to provide a desired voltage level. Random numbers can be generated by latching an output signal from the buffer 70 using an appropriate clock.

FIG. 14 is an electric circuit diagram showing the general configuration of a digital random number converting circuit including a high pass filter and a comparator.

A noise signal output by the noise source 30 is input to the input circuit 40. An output signal from the input circuit 40 is input to a high pass filter 80. An output signal from the high pass filter 80 is input to one terminal of the comparator 60. A reference voltage is input to the other terminal of the comparator 60. The high pass filter 80 removes a low frequency component from the noise signal. The comparator 60 compares the two signals input to the comparator 60 to output a high level signal or a low level signal.

In FIG. 14, the comparator 60 may fail to provide a sufficient output level depending on the levels of the signals input to the comparator 60 and the rates of variations of input signals as in the case of FIG. 13. Thus, the buffer 70 is connected to the comparator 60. The buffer 70 amplifies an output from the comparator 60 to provide a desired voltage level. Random numbers can be generated by latching an output signal from the buffer 70 using an appropriate clock.

FIG. 15 is a diagram showing an example of the configuration of the noise source 30. A resistor R and a noise generating device 31 are connected together in series. The voltage of an intermediate node is output as a noise signal.

Figure 16A:
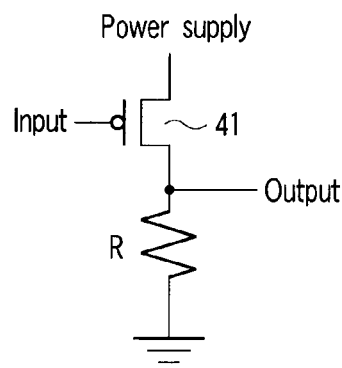
FIGS. 16A and 16B are diagrams showing an example of the configuration of an input circuit in the random number generating device in accordance with the embodiments.
Figure 16B:
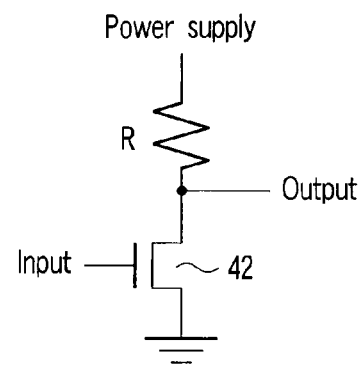

FIGS. 16A and 16B are diagrams showing examples of the configuration of the input circuit 40. In FIG. 16A, the input circuit 40 is composed of a P-type MOSFET 41 and the resistor R. In FIG. 16B, the input circuit 40 is composed of an N-type MOSFET 42 and the resistor R.

Figure 17A:
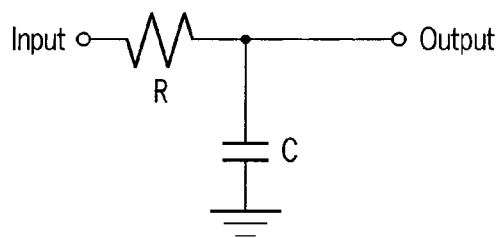
FIGS. 17A and 17B are diagrams showing an example of the configuration of a low pass filter and a high pass filter in the random number generating device in accordance with the embodiments.
Figure 17B:
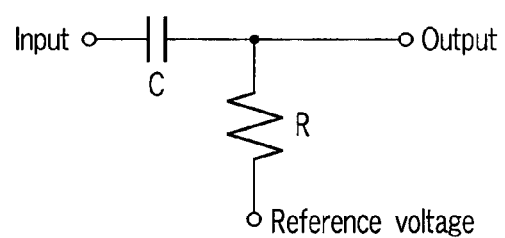

FIGS. 17A and 17B are diagrams showing examples of the configurations of the low pass filter 50 and the high pass filter 80. FIG. 17A shows an example of the configuration of the low pass filter 50. FIG. 17B shows an example of the configuration of the high pass filter 80. The low pass filter 50 and the high pass filter 80 are each composed of the resistor R and a capacitor C. Cutoff frequency is roughly determined by $1/(2\pi CR)$. Adjusting the capacitance value of the capacitor C and the resistance value of the resistor R enables adjusting the intensity of signals input to the comparator.

FIG. 18 is a diagram showing an example of the configuration of the comparator 60. The comparator 60 has two inputs, inputs 1 and 2. If the input 1 has a higher voltage than the input 2, the output has a low level voltage. In contrast, if the input 2 has a higher voltage than the input 1, the output has a high level voltage. If the difference in voltage between the inputs 1 and 2 is small or the voltages are in a less sensitive area, the output voltage fails to reach a fully high or low level. In this case, the buffer 70 is connected to the comparator 60.

FIG. 19 is a diagram showing an example of the configuration of the buffer 70. Amplifying an output from the comparator 60 using the buffer 70 provides a digital signal with a sufficient voltage level. In FIG. 19, the buffer 70 is composed of an inverter having an N-type MOSFET 71 and a P-type MOSFET 72.

Random numbers can be generated at a high speed by using the above digital random number converting circuit and using the noise generating device described in any of the embodiments as a noise source.

With the above digital random number converting circuit, adjusting the number of inverters used for the buffer 70 provides an optimum random number generating device depending on the rate of a vibration component at 1 MHz. In each of the above embodiments, the voltage applied to the noise generating device is about a few V, which corresponds to the band gap of silicon. Consequently, provided that the voltage fluctuation of an output signal is of the order of 10 mV, the fluctuation component is equal to about 1% of the input voltage. Similarly, provided that the voltage fluctuation of the output signal is of the order of 1 mV, the fluctuation component is equal to about 0.1% of the input voltage. Provided that the voltage fluctuation of the output signal is of the order of 0.1 mV, the fluctuation component is equal to about 0.01% of the input voltage. Typically, the amplification factor of an operation amplifier constituting the comparator 60 is about 100 at 1 MHz. Accordingly, a voltage fluctuation of about 10 mV enables digital random number signals to be taken without using any buffer. With a voltage fluctuation of the order of 0.1 mV, digital random number signals can be taken by providing one inverter serving as a buffer. With a voltage fluctuation of the order of 0.01 mV, digital random number signals can be taken by providing two inverters in series in the buffer. These have been confirmed through circuit simulations.

As described above, in the case where 1 MHz vibration component is at least 0.01%, a small and fast random number generating device can be provided by using two inverters to amplify an output from the comparator 60. Further, with a noise generating device that can generate random numbers in which 1-MHz vibration component is at least 0.1% as in the first to fifth embodiments, the buffer 70 can be composed of one inverter. With a noise generating device that can generate random numbers in which 1-MHz vibration component is at least 1% as in the sixth embodiment, a small and fast random generating device can be provided without using the buffer 70.

As already described, in the noise generating device in accordance with the embodiments of the present invention, a smaller tunnel insulating film thickness is better. In particular, the tunnel insulating film thickness T is desirably at most 0.7 nm. If a silicon nitride film is used as a trap insulating film, a greater Si/N ratio results in a higher dangling bond density. The two conditions T=0.7 nm and Si/N=1 will be described below.

The tunnel resistance increases exponentially relative to the tunnel insulating film thickness T. Thus, desirably, the tunnel insulating film is as thin as possible or no tunnel insulating film is formed. However, normal manufacturing processes form a native oxide film on the silicon substrate. The native oxide film has a typical thickness value of 0.7 nm. Accordingly, setting the tunnel insulating film thickness T equal to or smaller than 0.7 nm means that the tunnel insulating film thickness T is equal to or smaller than the native oxide film thickness. That is, the value of 0.7 nm is based on the native oxide film thickness.

In a silicon nitride film ($Si_UN$), the number of dangling bonds normally increases consistently with the U value, that is, the Si/N ratio. Consequently, increasing the U value normally enables an increase in the level of noise. However, a significantly increased U value results in excess Si, so that an Si—Si network starts to be formed. This prevents an increase in the number of Si dangling bonds in spite of an increased U value. The number of dangling bonds is expected to be maximized at a U value of about 1 (Si/N=1) (see J. Robertson, Philosophical Magazine B, 1994, Vol. 69, No. 2, 307 to 326). Therefore, Si/N=1 is expected to be a value at which the level of the noise component based on dangling bonds is maximized.

Thus, for a noise generating device that can generate random numbers in which 1-MHz vibration component is at least 0.01%, L and W have only to meet the following condition:

$$1/(L \cdot W^{2/5}) \geq 2.23 \, [\mu m^{-7/5}]$$

For a noise generating device that can generate random numbers in which 1-MHz vibration component is at least 0.1%, L and W have only to meet the following condition:

$$1/(L \cdot W^{2/5}) \geq 22.25 \, [\mu m^{-7/5}]$$

For a noise generating device that can generate random numbers in which 1-MHz vibration component is at least 1%, L and W have only to meet the following condition:

$$1/(L \cdot W^{2/5}) \geq 2.23 \times 10^2 \, [\mu m^{-7/5}]$$

Further, as already described, experimental data on a silicon nitride film ($Si_UN$:U>0.75) indicates that the Fourier coefficient is proportional to $a \times ((U-0.75)/(1+U) + 0.01174)^{1/2}$. The term $a \times 0.01174^{1/2}$ corresponds to the typical target value for the noise intensity at U=0.75. However, for example, this value may vary depending on the content of O atoms in a silicon oxinitride film. Film formation conditions may also vary the above value. The desired noise component is desirably generated even though the value $a \times 0.01174^{1/2}$ is 0 when noise is most unlikely to be generated, that is, when stoichiometry has been achieved. In this case, for a noise generating device that can generate random numbers in which 1-MHz vibration component is at least 0.01%, the following relation is satisfied:

$$[x/(x+7-4y) \times \{(4-4y)/(4-2y)+2y/(4-2y) \times 2\}]^{1/2} \times \exp(-T\{H/3.1 \, [eV]\}^{1/2}/0.8664 \, [nm])/LW^{2/5} \geq 0.37 \, [\mu m^{-7/5}]$$

For a noise generating device that can generate random numbers in which 1-MHz vibration component is at least 0.1%, the following relation is satisfied:

$$[x/(x+7-4y) \times \{(4-4y)/(4-2y)+2y/(4-2y) \times 2\}]^{1/2} \times \exp(-T\{H/3.1 \, [eV]\}^{1/2}/0.8664 \, [nm])/LW^{2/5} \geq 3.67 \, [\mu m^{-7/5}]$$

For a noise generating device that can generate random numbers in which 1-MHz vibration component is at least 1%, the following relation is satisfied:

$$[x/(x+7-4y) \times \{(4-4y)/(4-2y)+2y/(4-2y) \times 2\}]^{1/2} \times \exp(-T\{H/3.1 \, [eV]\}^{1/2}/0.8664 \, [nm])/LW^{2/5} \geq 36.67 \, [\mu m^{-7/5}]$$

In the above description, on condition that a large number of dangling bonds are present in the silicon oxinitride film, the contribution of the dangling bonds to fluctuations is assumed to depend on ½ power on the basis of the general statistical law. Accordingly, this assumption is not applied to the case of $SiO_2$, with which the silicon oxinitride film does not have many dangling bonds.

As already described, the trap insulating film is expressed by the general formula $Si_x(SiO_2)_y(Si_3N_4)_{1-y}M_z$ (M is an element other than Si, O, and N; $x \geq 0$, $1 \geq y \geq 0$, $z \geq 0$; the case where x=0 and y=1 and z=0 is excluded). Here, examples of M include metal elements such as hafnium, lanthanum, and zirconium.

The trap insulating film is mainly composed of a silicon nitride film, a silicon oxide film, or a silicon oxinitride film. Accordingly, the number of atoms (x+7−4y) of the silicon oxinitride film or the like is desirably equal to or greater than that z of the element M. Therefore, desirably, "$z \leq x+7-4y$".

Further, the trap insulating film desirably contains a large number of traps based on dangling bonds. Since the number of Si dangling bonds normally increases consistently with the x value, the x value is desirably larger. However, the number of excess Si atoms per atom (x/(x+7−4y)) is desirably "x/(x+7−4y)$\leq$0.596". That is, desirably, "$x \leq 0.596 \, (7-4y)/(1-0.596)$". With $Si_UN$, increasing the U value from 0.75 increases the number of Si dangling bonds based on excess Si. Too much excess Si causes Si atoms to be re-bonded together, so that the number of dangling bonds starts to decrease from a peak near U=1. The number of dangling bonds at a U value of about 10/3 is almost equal to the number of dangling bonds at a U value of 0.75 (see, for example, "S. Hasegawa et al., Appl. Phys. Lett. Vol. 58, pp 741 to 743 (1991)"). The chance that Si atoms are re-bonded together depends on the number of excess Si atoms per atom. The number of excess Si atoms per atom at U=10/3 is (U−0.75)/(1+U)=0.596. Therefore, the number of excess Si atoms per atom is desirably at most 0.596.

The above embodiments use a silicon substrate as a semiconductor substrate but may use a semiconductor substrate other than silicon.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A random number generating device comprising:
a semiconductor device including a source region, a drain region, a channel region provided between the source region and the drain region, and an insulating portion provided on the channel region, the insulating portion including a trap insulating film having traps based on dangling bonds and expressed by $Si_UN$ (U=0.75), conductivity of the channel region varying randomly depending on the amount of charge caught in the traps; and
a random number generating unit connected to the semiconductor device and generating random numbers based on a random variation in the conductivity of the channel region;
wherein when a gate length is defined as L [μm], a channel width of the channel region is defined as W [μm], a thickness of a tunnel insulating film between the channel region and the trap insulating film is defined as T [nm] (T$\geq$0), and a barrier height of the tunnel insulating film is defined as H [eV], the following relation is satisfied:

$$((U-0.75)/(1+U)+0.01174)^{1/2} \times \exp(-T\{H/3.1 \, [eV]\}^{1/2}/0.8664 [nm])/LW^{2/5} \geq 0.37 \, [\mu m^{-7/5}].$$

2. The device according to claim 1, wherein when a gate length is defined as L [μm] and a channel width of the channel region is defined as W [μm], the following relation is satisfied:

$$1/(L \times W^{2/5}) \geq 2.23 \ [\mu m^{-7/5}].$$

3. The device according to claim 1, wherein when a gate length is defined as L [μm] and a channel width of the channel region is defined as W [μm], the following relation is satisfied:

$$1/(L \times W^{2/5}) \geq 22.25 \ [\mu m^{-7/5}].$$

4. A random number generating device comprising:
a semiconductor device including a source region, a drain region, a channel region provided between the source region and the drain region, and an insulating portion provided on the channel region, the insulating portion including a trap insulating film having traps based on dangling bonds and expressed by $Si_x(SiO_2)_y(Si_3N_4)_{1-y}$ (x≧0, 1>y>0), conductivity of the channel region varying randomly depending on the amount of charge caught in the traps; and
a random number generating unit connected to the semiconductor device and generating random numbers based on a random variation in the conductivity of the channel region,
wherein when a gate length is defined as L [μm], a channel width of the channel region is defined as W [μm], a thickness of a tunnel insulating film between the channel region and the trap insulating film is defined as T [nm] (T≧0), and a barrier height of the tunnel insulating film is defined as H [eV], the following relation is satisfied:

$$[x/(x+7-4y) \times \{(4-4y)/(4-2y) + 2y/(4-2y) \times 2\} + 0.01174]^{1/2} \times$$
$$\exp(-T\{H/3.1[eV]\}^{1/2}/0.8664[nm])/LW^{2/5} \geq 0.37[\mu m^{-7/5}].$$

5. A random number generating device comprising:
a semiconductor device including a source region, a drain region, a channel region provided between the source region and the drain region, and an insulating portion provided on the channel region, the insulating portion including a trap insulating film having traps based on dangling bonds and expressed by $Si_V O$ (V>0.5), conductivity of the channel region varying randomly depending on the amount of charge caught in the traps; and
a random number generating unit connected to the semiconductor device and generating random numbers based on a random variation in the conductivity of the channel region,
wherein when a gate length is defined as L [μm], a channel width of the channel region is defined as W [μm], a thickness of a tunnel insulating film between the channel region and the trap insulating film is defined as T [nm] (T≧0), and a barrier height of the tunnel insulating film is defined as H [eV], the following relation is satisfied:

$$[\{(V-0.5)/(V+1)\} \times 2 + 0.01174]^{1/2} \times$$
$$\exp(-T\{H/3.1 \ [eV]\}^{1/2}/0.8664 \ [nm])/LW^{2/5} \geq 3.67 \ [\mu m^{-7/5}].$$

6. A random number generating device comprising:
a semiconductor device including a source region, a drain region, a channel region provided between the source region and the drain region, and an insulating portion provided on the channel region, the insulating portion including a trap insulating film having traps based on dangling bonds and expressed by $Si_x(SiO_2)_y(Si_3N_4)_{1-y}$ (x≧0, 1>y>0), conductivity of the channel region varying randomly depending on the amount of charge caught in the traps; and
a random number generating unit connected to the semiconductor device and generating random numbers based on a random variation in the conductivity of the channel region,
wherein when a gate length is defined as L [μm], a channel width of the channel region is defined as W [μm], a thickness of a tunnel insulating film between the channel region and the trap insulating film is defined as T [nm] (T≧0), and a barrier height of the tunnel insulating film is defined as H [eV], the following relation is satisfied:

$$[x/(x+7-4y) \times \{(4-4y)/(4-2y) + 2y/(4-2y) \times 2\} + 0.01174]^{1/2} \times$$
$$\exp(-T\{H/3.1[eV]\}^{1/2}/0.8664[nm])/LW^{2/5} \geq 3.67[\mu m^{-7/5}].$$

7. A random number generating device comprising:
a semiconductor device including a source region, a drain region, a channel region provided between the source region and the drain region, and an insulating portion provided on the channel region, the insulating portion including a trap insulating film having traps based on dangling bonds and expressed by $Si_V O$ (V>0.5), conductivity of the channel region varying randomly depending on the amount of charge caught in the traps; and
a random number generating unit connected to the semiconductor device and generating random numbers based on a random variation in the conductivity of the channel region,
wherein when a gate length is defined as L [μm], a channel width of the channel region is defined as W [μm], a thickness of a tunnel insulating film between the channel region and the trap insulating film is defined as T [nm] (T≧0), and a barrier height of the tunnel insulating film is defined as H [eV], the following relation is satisfied:

$$[\{(V-0.5)/(V+1)\} \times 2 + 0.01174]^{1/2} \times$$
$$\exp(-T\{H/3.1 \ [eV]\}^{1/2}/0.8664 \ [nm])/LW^{2/5} \geq 3.67 \ [\mu m^{-7/5}].$$

8. A random number generating device comprising:
a semiconductor device including a source region, a drain region, a channel region provided between the source region and the drain region, and an insulating portion provided on the channel region, the insulating portion including a trap insulating film having traps based on dangling bonds and expressed by $Si_x(SiO_2)_y(Si_3N_4)_{1-y}M_z$ (M is an element other than Si, O, and N; x≧0, 1≧y≧0, z≧0; the case where x=0 and y=1 and z=0 is excluded), conductivity of the channel region varying randomly depending on the amount of charge caught in the traps; and
a random number generating unit connected to the semiconductor device and generating random numbers based on a random variation in the conductivity of the channel region,
wherein when a gate length is defined as L [μm], a channel width of the channel region is defined as W [μm], a thickness of a tunnel insulating film between the channel region and the trap insulating film is defined as T [nm]

($T \geq 0$), and a barrier height of the tunnel insulating film is defined as H [eV], the following relation is satisfied:

$$[x/(x+7-4y+z) \times \{(4-4y)/(4-2y)+2y/(4-2y) \times 2\}+0.01174]^{1/2} \times \exp(-T\{H/3.1 \text{ [eV]}\}^{1/2}/0.8664 \text{ [nm]})/LW^{2/5} >= 36.67 \text{ [}\mu\text{m}^{-7/5}\text{]}.$$

9. The device according to claim 8, wherein the trap insulating film is expressed by $Si_x(SiO_2)_y(Si_3N_4)_{1-y}$ ($x \geq 0$, $1 > y > 0$), and the following relation is satisfied:

$$[x/(x+7-4y) \times \{(4-4y)/(4-2y)+2y/(4-2y) \times 2\}+(0.01174)]^{1/2} \times \exp(-T\{H/3.1 \text{ [eV]}\}^{1/2}/0.8664 \text{ [nm]})/LW^{2/5} >= 36.67 \text{ [}\mu\text{m}^{-7/5}\text{]}.$$

10. The device according to claim 8, wherein the trap insulating film is expressed by $Si_UN$ ($U \geq 0.75$), and the following relation is satisfied:

$$((U-0.75)/(1+U)+0.01174)^{1/2} \times \exp(-T/0.8664 \text{ [nm]})/LW^{2/5} \geq 36.67 \text{ [}\mu\text{m}^{-7/5}\text{]}.$$

11. The device according to claim 8, wherein the trap insulating film is expressed by $Si_VO$ ($V > 0.5$), and the following relation is satisfied:

$$[\{(V-0.5)/(V+1)\} \times 2+0.01174]^{1/2} \times \exp(-T\{H/3.1 \text{ [eV]}\}^{1/2}/0.8664 \text{ [nm]})/LW^{2/5} \geq 36.67 \text{ [}\mu\text{m}^{-7/5}\text{]}.$$

12. The device according to claim 8, wherein when a gate length is defined as L [μm] and a channel width of the channel region is defined as W [μm], the following relation is satisfied:

$$1/(L \times W^{2/5}) \geq 2.23 \times 10^2 \text{ [}\mu\text{m}^{-7/5}\text{]}.$$

13. The device according to claim 8, wherein the trap insulating film is expressed by $Si_x(SiO_2)_y(Si_3N_4)_{1-y}M_z$ ($x > 0$, $1 \geq y \geq 0$, $z \geq 0$), and the following relation is satisfied:

$$[x/(x+7-4y+z) \times \{(4-4y)/(4-2y)+2y/(4-2y) \times 2\}]^{1/2} \times \exp(-T\{H/3.1 \text{ [eV]}\}^{1/2}/0.8664 \text{ [nm]})/LW^{2/5} \geq 36.67 \text{ [}\mu\text{m}^{-7/5}\text{]}.$$

* * * * *